United States Patent [19]

Sloan et al.

[11] Patent Number: 5,515,403
[45] Date of Patent: May 7, 1996

[54] APPARATUS AND METHOD FOR CLOCK ALIGNMENT AND SWITCHING

[75] Inventors: Keith A. Sloan, Carrollton; Mark A. Lovell, Allen, both of Tex.

[73] Assignee: DSC Communications Corporation, Plano, Tex.

[21] Appl. No.: 262,921

[22] Filed: Jun. 21, 1994

[51] Int. Cl.$^6$ .................................................. H04L 7/00
[52] U.S. Cl. ................ 375/371; 375/357; 327/262; 327/144; 371/1
[58] Field of Search ............................. 375/357, 356, 375/371, 375, 347, 226; 371/1, 29.1; 328/155, 63, 66, 67, 72, 137, 133; 327/2, 3, 20, 261, 262, 161, 147, 182, 183, 199, 202, 270, 276, 269, 298, 378, 392, 393, 144

[56] References Cited

U.S. PATENT DOCUMENTS

| | | | |
|---|---|---|---|
| 3,769,607 | 10/1973 | Thelen | 331/2 |
| 4,229,699 | 10/1980 | Frissell | 375/357 |
| 4,755,704 | 7/1988 | Flora et al. | 327/262 |
| 4,789,996 | 12/1988 | Butcher | 375/376 |
| 4,868,514 | 9/1989 | Azevedo et al. | 328/155 |
| 5,054,038 | 10/1991 | Hedberg | 375/371 |
| 5,065,454 | 11/1991 | Binz et al. | 359/184 |
| 5,122,679 | 6/1992 | Ishii et al. | 327/147 |
| 5,184,027 | 2/1993 | Masuda et al. | 307/63 |
| 5,204,559 | 4/1993 | Deyhimy et al. | 307/480 |
| 5,214,680 | 5/1993 | Gutierrez, Jr. et al. | 377/20 |
| 5,258,660 | 11/1993 | Nelson et al. | 328/63 |
| 5,260,979 | 11/1993 | Parker et al. | 375/357 |
| 5,272,390 | 12/1993 | Watson, Jr. et al. | 307/269 |
| 5,289,138 | 2/1994 | Wang | 331/49 |
| 5,298,866 | 3/1994 | Kaplinsky | 328/155 |
| 5,309,035 | 5/1994 | Watson, Jr. et al. | 328/63 |
| 5,388,100 | 2/1995 | Ohtsuka | 375/357 |
| 5,410,263 | 4/1995 | Waizman | 327/261 |
| 5,416,807 | 5/1995 | Brady et al. | 375/371 |
| 5,422,915 | 6/1995 | Byers et al. | 375/357 |
| 5,448,193 | 9/1995 | Baumert et al. | 327/156 |

Primary Examiner—Stephen Chin
Assistant Examiner—Tesfaldet Bocure
Attorney, Agent, or Firm—Baker & Botts

[57] ABSTRACT

In a telecommunication system having multiple timing subsystems receiving and distributing redundant timing signals, there is provided a circuitry for aligning first and second redundant timing signals and switching therebetween. The circuitry includes a selecting and switching circuitry for receiving the first and second redundant timing signals and designating one of the redundant timing signals as ACTIVE and the other as INACTIVE, and providing the ACTIVE timing signal as an output timing reference signal. The selecting and switching circuitry further switching the ACTIVE and INACTIVE timing signal designation and output timing reference signal in response to detecting fault or a clock switching command. The ACTIVE timing signal is provided to a first delay path having a programmable delay value, which delays it and produces a first output timing signal. A second delay path receives the INACTIVE redundant timing signal and produces a second output timing signal. The circuitry further includes a phase detector which receives the ACTIVE and INACTIVE output timing signals and generates a status signal indicative of phase relationship therebetween. The circuitry further provides for temperature compensation which measures and compensates for an effect of temperature change on the delay paths.

40 Claims, 18 Drawing Sheets

APPARATUS AND METHOD FOR CLOCK ALIGNMENT AND SWITCHING

TECHNICAL FIELD OF THE INVENTION

This invention relates in general to the field of timing circuitry. More particularly, the present invention relates to apparatus and method for clock alignment and switching.

BACKGROUND OF THE INVENTION

In synchronous circuit applications, the clock signal is of the utmost importance. In particular, telecommunication switching systems require dependable timing signals to operate properly and to transmit digital data signals error free. To avoid failures caused by errors such as loss of clock and loss of frame, and to facilitate system fault diagnosis and testing, redundant timing signals may be provided. By using redundant timing signals, the system may operate with a backup timing signal upon detection of erroneous conditions in the active timing signal. Craft persons may also manually swap the timing signals in order to perform system diagnostics, maintenance and/or repairs. In telecommunication systems where high-speed data are transmitted, even single bit errors cannot be tolerated. It may be seen that in order to switch from one active clock signal to the other, the clock signals must be fully synchronous in frequency and phase to avoid producing bit errors in the data transmission.

Accordingly, a need has arisen for a circuit to closely phase align and switch between two or more timing signals. Additionally, such a circuit must also compensate for the effects of varying temperature on circuit operations.

SUMMARY OF THE INVENTION

In accordance with the present invention, apparatus and method for clock alignment and switching are provided which eliminate or substantially reduce the disadvantages associated with systems without such capabilities.

In one aspect of the invention, the circuitry includes a reference selecting and switching circuitry for designating one of the redundant timing signals as ACTIVE and the other as INACTIVE. The ACTIVE and INACTIVE timing signals are provided to first delay paths, respectively, which delays the timing signals by programmable delay amounts. A phase detector is coupled to the first and second delay paths to receive the delayed ACTIVE and INACTIVE output timing signals, and generate a status signal indicative of phase relationship therebetween. A controller is coupled to the phase detector for controlling the delay values of the first and second delay paths to phase align the timing signals in response to the status signal.

In another aspect of the invention, a telecommunication system may have multiple timing subsystems receiving and distributing redundant timing signals. There is provided a circuitry for aligning the redundant timing signals and switching therebetween when a fault occurs or when commanded to do so. The timing signal alignment and switching circuitry includes a selecting and switching circuitry for receiving the first and second redundant timing signals and designating one of the redundant timing signals as ACTIVE and the other as INACTIVE, and providing the ACTIVE timing signal as an output timing reference signal. The selecting and switching circuitry further switches the ACTIVE and INACTIVE timing signal designation and outputs the timing reference signal in response to detecting fault or a clock switching command. The ACTIVE timing signal is provided to a first delay path having a programmable delay value, which delays it and produces a first output timing signal. A second delay path receives the INACTIVE redundant timing signal and produces a second output timing signal. The circuitry further includes a phase detector which receives the ACTIVE and INACTIVE output timing signals and generates a status signal indicative of phase relationship therebetween. The circuitry further provides for temperature compensation which measures and compensates for measurable effect of temperature change on the delay paths.

In yet another aspect of the invention, a method for aligning and switching between first and second redundant timing signals includes the steps of first selecting one of the first and second timing signals as an ACTIVE timing signal and the other as an INACTIVE timing signal, and providing the ACTIVE timing signal as an output timing reference. Next it detects a phase relationship of the ACTIVE and INACTIVE timing signals, and incrementally delays the INACTIVE timing signal until the INACTIVE timing signal is in phase alignment with the ACTIVE timing signal. The circuitry switches the ACTIVE and INACTIVE timing signals and the output timing reference in response to a fault in the ACTIVE timing signal or a clock switching command.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–20 of the drawings, like numerals being used for like and corresponding parts of the various drawings.

Figure 1:
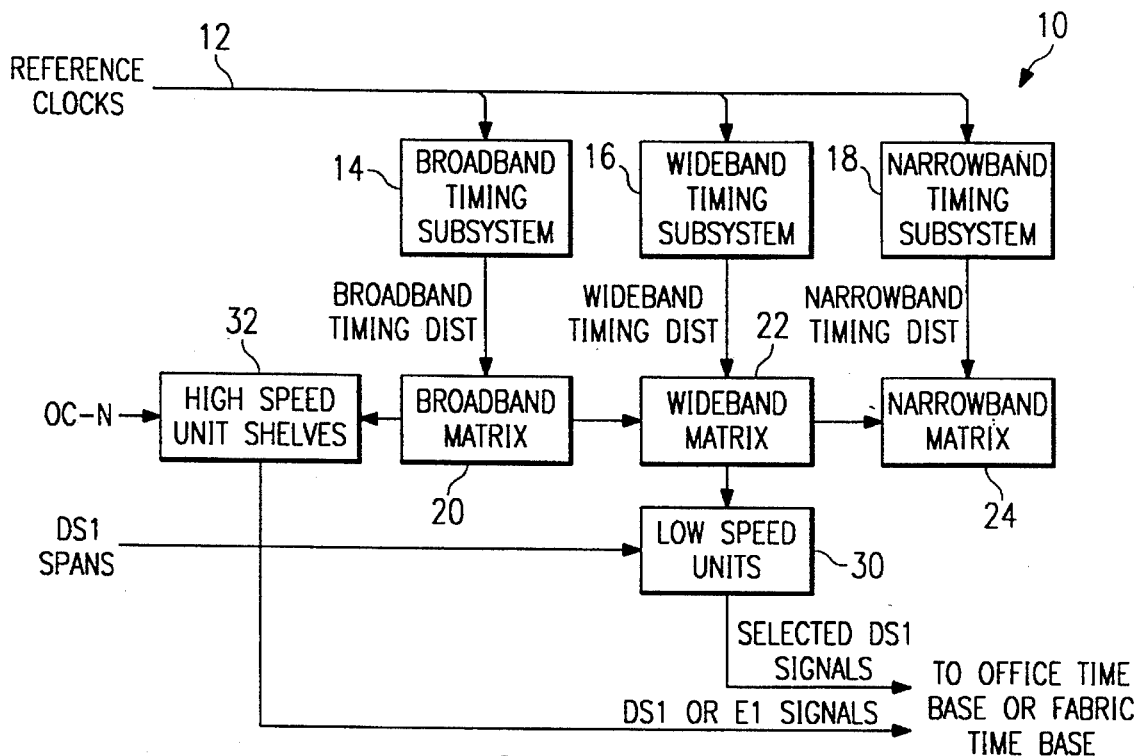
FIG. 1 is a simplified block diagram of timing distribution in an integrated cross-connect switching system.

Referring to FIG. 1, a timing distribution scheme 10 of an integrated multi-fabric digital cross-connect system is shown to illustrate a possible operating environment of the present invention. Two or more reference clock signals 12 are provided to broadband, wideband, and narrowband timing subsystems 14–18. Reference clock signals 12, which may include clock and frame information, provide redundancy and the capability to switch between them when one is erroneous. In the telecommunications environment, system integrity and reliability provided by such redundancy is vital. As shown, redundant reference clocks 12 may be derived from signals received from the network, such as a selected DS1 signal generated in low speed units 30 from DS1 spans, or DS1 and E1 signals generated in high speed unit shelves 32 from received optical signals, such as OC-3 or OC-12 signals. Alternatively, the reference clocks 12 may be sourced by a pair of office timing supplies (BITS).

Each timing subsystem 14–18 receives the redundant reference clocks, selects one as the active clock signal, and generates timing signals based on the selected active clock. The derived timing signals are then hierarchically distributed to cross-connect matrices 20–24. If the active clock signal incurs some fault, then a switch to another timing reference signal can be performed. The timing signal also may be switched because of system maintenance, diagnostics and repair. To avoid errors in data transmission, the two phase-locked reference clock signals are sufficiently in alignment, so that a planned timing signal switch produces less than a predetermined amount of phase distortion in the final clock output. For the integrated multi-fabric cross-connect environment, the goal is to generate less than one nanosecond of phase distortion.

Figure 2:
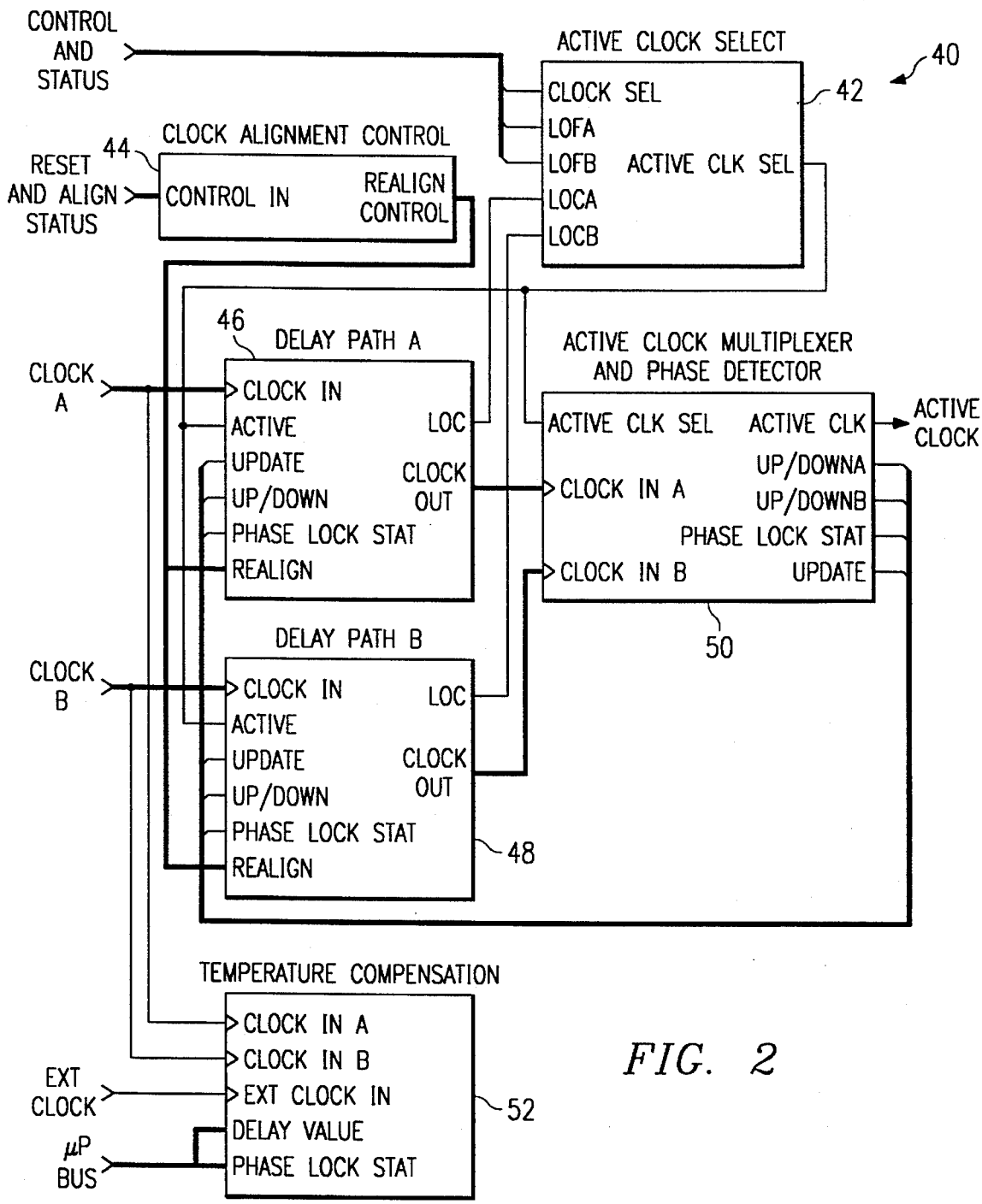
FIG. 2 is a top level block diagram of one embodiment of the invention.

Referring to FIG. 2, reference clocks 12, hereinafter CLOCK A and CLOCK B, are received by a clock alignment circuit 40 to perform active clock signal selection, internal clock signal alignment, and active clock signal switching. Clock alignment circuit 40 includes an active clock selection circuitry 42, which determines which reference clock signal is the active clock signal, or the ACTIVE CLOCK, and which signal is the inactive signal, or the INACTIVE CLOCK signal. Selection may be performed by evaluating the loss of clock (LOC), loss of frame (LOF), and other relevant status or conditions of the timing signals. If the currently active clock incurs a LOC or LOF condition, the other reference clock, if error free, is selected as the new active clock signal. The LOC and LOF conditions may be determined by circuitry or other means as known in the art. The active clock selection may also be performed based on some other conditions not described herein. Alternatively, the active clock selection may be manually set via the control signal inputs to active clock selection circuitry 42, such as a CLOCK SELECT signal, or initialized to default selections upon power up.

Clock alignment circuit 40 further includes a clock alignment control circuitry 44, which controls the operations of delay path A and delay path B 46 and 48, respectively. By using programmable delay paths A or B, the INACTIVE CLOCK is delayed by a computed amount to achieve phase alignment with the ACTIVE CLOCK to within one nanosecond. An active clock multiplexer and phase detector circuitry 50 provides control signals to delay paths A and B 46 and 48 to vary the amount of delay introduced. The control signals may include up/down commands, update and phase lock status signals. Because process, temperature and voltage (PTV) variations affect the amount of delay introduced by each delay element in delay paths A and B 46 and 48, a compensation circuitry 52 is further provided to account for those variations. Because temperature is the main factor affecting the changes, compensation circuitry 52 is hereinafter referred to as temperature compensation circuitry 52.

Figure 3:
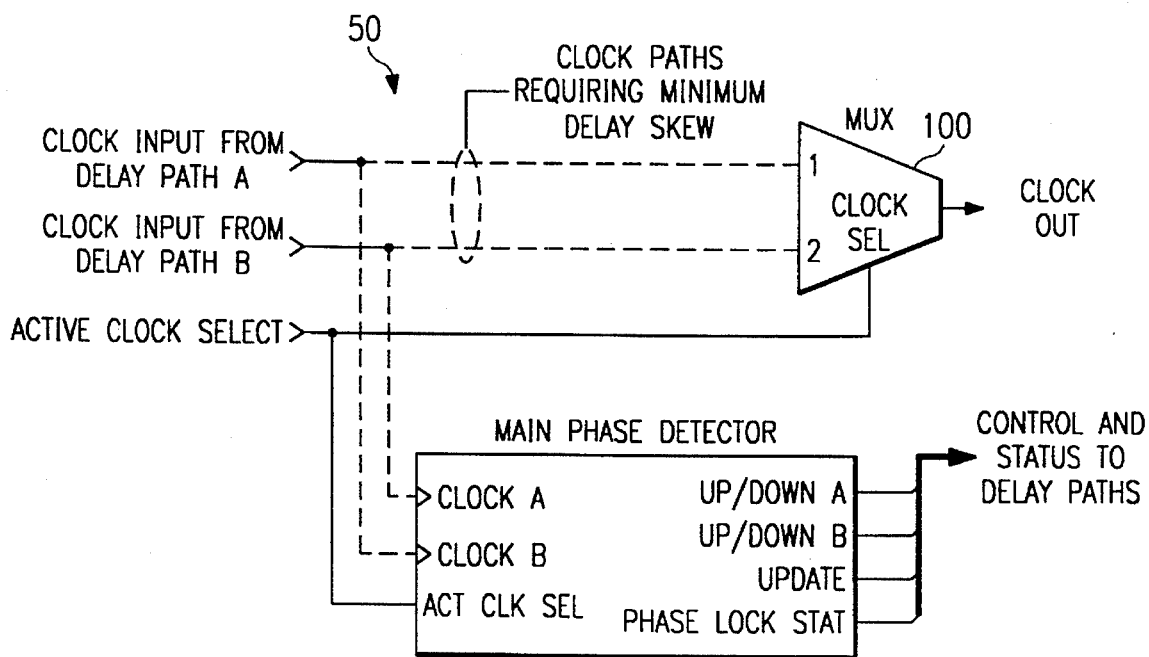
FIG. 3 is a block diagram of the active clock multiplexer and main phase detector.

Referring to FIG. 3, a more detailed block diagram of active clock multiplexer and phase detector circuitry 50 is shown. A multiplexer 100 receives the output from delay path A and delay path B and selects one as the ACTIVE CLOCK as controlled by the ACTIVE CLOCK SELECT signal from active clock select circuitry 42. The ACTIVE CLOCK has been subjected to a delay path having a preferred delay value. The same outputs from both delay paths A and B are provided to a main phase detector 102, which determines the phase relationship between the ACTIVE CLOCK and the INACTIVE CLOCK. Depending on the detected phase relationship, the main phase detector 102 generates UP/DOWN A, UP/DOWN B, or PHASE LOCK STATUS signals. The UP/DOWN signal is used by the corresponding inactive delay path to increase or decrease the propagation delay of the path, as well as to keep the reference clocks from locking with an 180 degree phase difference. If the ACTIVE CLOCK and the INACTIVE CLOCK are substantially synchronous in phase, then the PHASE LOCK STATUS signal so indicates and no further adjustment to the path delays are necessary. It may be necessary to provide a phase detector 102 that is "balanced" i.e., detection of lock and out-of-lock conditions occurs within approximately the same amount of time from the respective clock edges.

Figure 4:
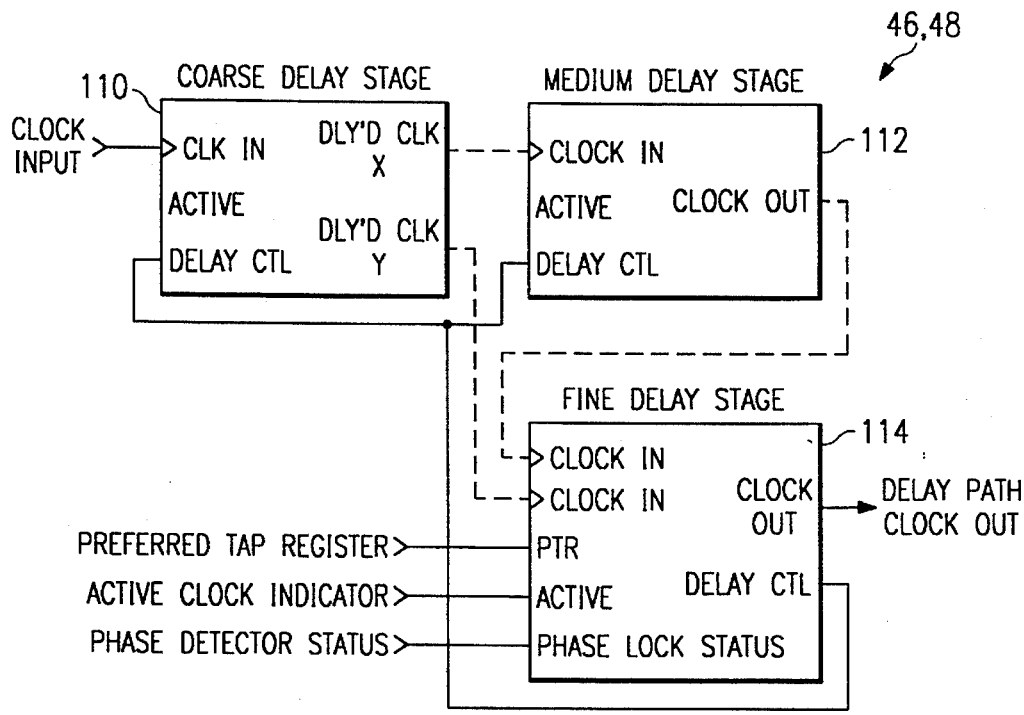
FIG. 4 is a block diagram of an embodiment of a delay path.

Referring to FIG. 4, a more detailed block diagram of delay paths 46 and 48 are shown. Delay paths 46 and 48 introduce programmable delays to the ACTIVE and INACTIVE reference clocks and may be configured as a concatenated series of a coarse delay stage 110, a medium delay stage 112, and a fine delay stage 114. As the names imply, delay stages 110–114 are constructed of delay elements capable of introducing a varying resolution of propagation delay values into the paths of the reference clocks. For example, coarse delay stage 110 may include a series of 22 delay elements, each capable of introducing 10–29 nanoseconds of delay into the delay path depending on the process, temperature and voltage (PTV) conditions; medium delay stage 112 may include 15 delay elements, each with 1.4 nanoseconds of delay at typical PTV conditions; and fine delay stage 114 may include 128 delay elements, each with 0.2 nanoseconds of delay at typical PTV conditions. For an infinite fine mode of operation described in detail below, the total amount of fine delay should be greater than one coarse delay.

As shown in FIG. 4, coarse delay stage 110 generates two delayed outputs, X and Y, where output X is coupled to the clock input of medium delay stage 112, and output Y is coupled to one clock input of fine delay stage 114. A second clock input of fine delay stage 114 receives the clock output from medium delay stage 112. Accordingly, two parallel delay pipelines are formed: one passing through coarse, medium, and fine delay stages 110–114, the other passing through coarse and fine delay stages 110 and 114 only. These two pipelines are hereinafter referred to as the master and slave path portions, where master denotes the path in the INACTIVE delay path carrying the signal that is being aligned with the signal on the ACTIVE delay path. The slave path portion denotes the path carrying the signal that is being aligned with the signal on the master path portion. As described in more detail below, master and slave delay pipelines may be used to compensate for a virtually unlimited range of delay.

As shown in FIG. 4, fine delay stage 114 further receives the preferred tap register values, the active clock indicator, and the main phase detector status. The preferred tap register contains a fixed reference delay value for the ACTIVE CLOCK while the INACTIVE CLOCK is aligned with the ACTIVE CLOCK. The preferred delay amount provides a fixed reference point to minimize phase wander when switching between the two clock references is performed. When the clocks are switched, the delay of the current ACTIVE CLOCK (previously the INACTIVE CLOCK) slowly drifts back to the preferred tap values, while the current INACTIVE CLOCK tracks and is aligned with it. The preferred delay amount may be a point at or near the center of the delay range of the delay paths. The active clock indicator from active clock select circuitry 42 informs each delay path whether it has been selected as the ACTIVE path. Main phase detector status signals may include the UPDATE, UP/DOWN, and LOCK outputs from main phase detector 102. In turn, fine delay stage 114 generates and provides a number of DELAY CONTROL signals to coarse and medium delay stages 110 and 112. Fine delay stage 114 also outputs the final delayed output from the delay path.

Figure 5:
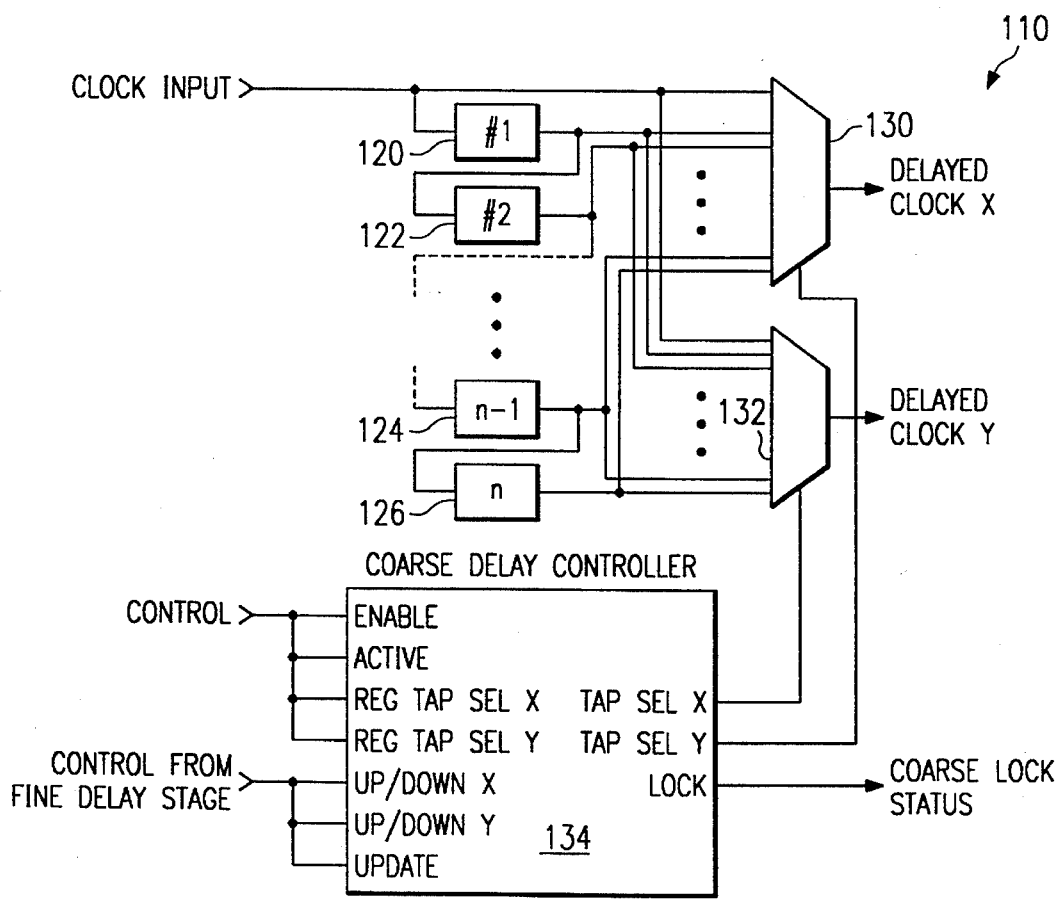
FIG. 5 is a more detailed block diagram of an embodiment of a coarse delay stage.

Referring to FIG. 5, a more detailed block diagram of coarse delay stage 110 is shown. Coarse delay stage 110 includes an array of tapped coarse delay elements 120–126 coupled to two output multiplexers 130 and 132 to provide delayed clocks X and Y, respectively. As described in more detail below, the X and Y outputs are controlled and used as master and slave delay pipelines. The use of master and slave delay pipelines alternately provides clock alignment circuitry 40 the ability to compensate for an infinite range of delay especially at the fine delay resolution. Output multiplexers 130 and 132 are controlled by a coarse delay controller 134, which receives control signals from active clock select circuitry 42, active clock multiplexer and phase detector circuitry 50, and from fine delay stage 14. In addition, coarse delay controller 134 generates a COARSE LOCK status signal to indicate that a phase lock between the clock signals has been achieved at the coarse delay level.

Figure 6:
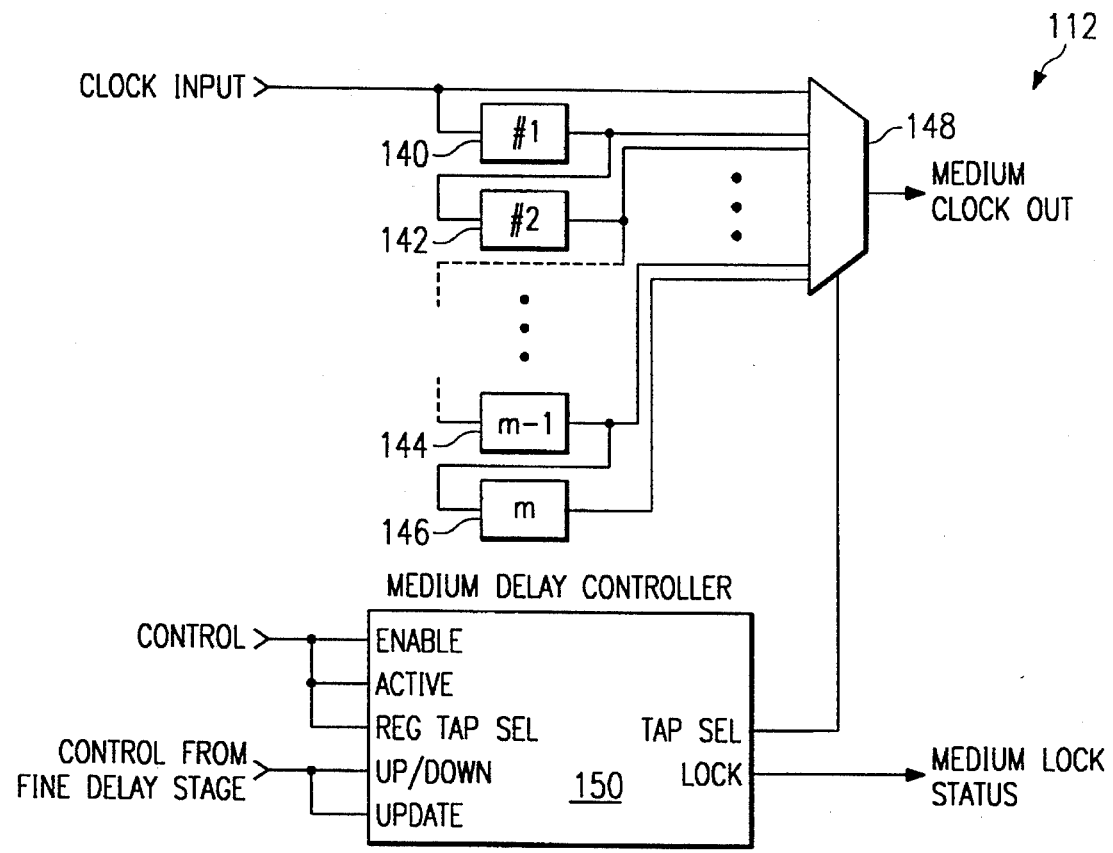
FIG. 6 is a more detailed block diagram of an embodiment of a medium delay stage.

Referring to FIG. 6, a simplified block diagram of medium delay stage 112 is shown. Medium delay stage 112 includes an array of medium delay elements 140–146 which receive the DELAYED CLOCK X output from coarse delay stage 110 and whose tapped outputs are coupled an output multiplexer 148. A medium delay controller 150 controls the multiplexed tap selection of medium delay elements 140–146. Medium delay controller 150 also receives control signals from active clock select circuitry 42, active clock multiplexer and phase detector circuitry 50, and from fine delay stage 114. A MEDIUM LOCK status signal is provided as an output to indicate phase alignment at the medium delay level.

Figure 7:
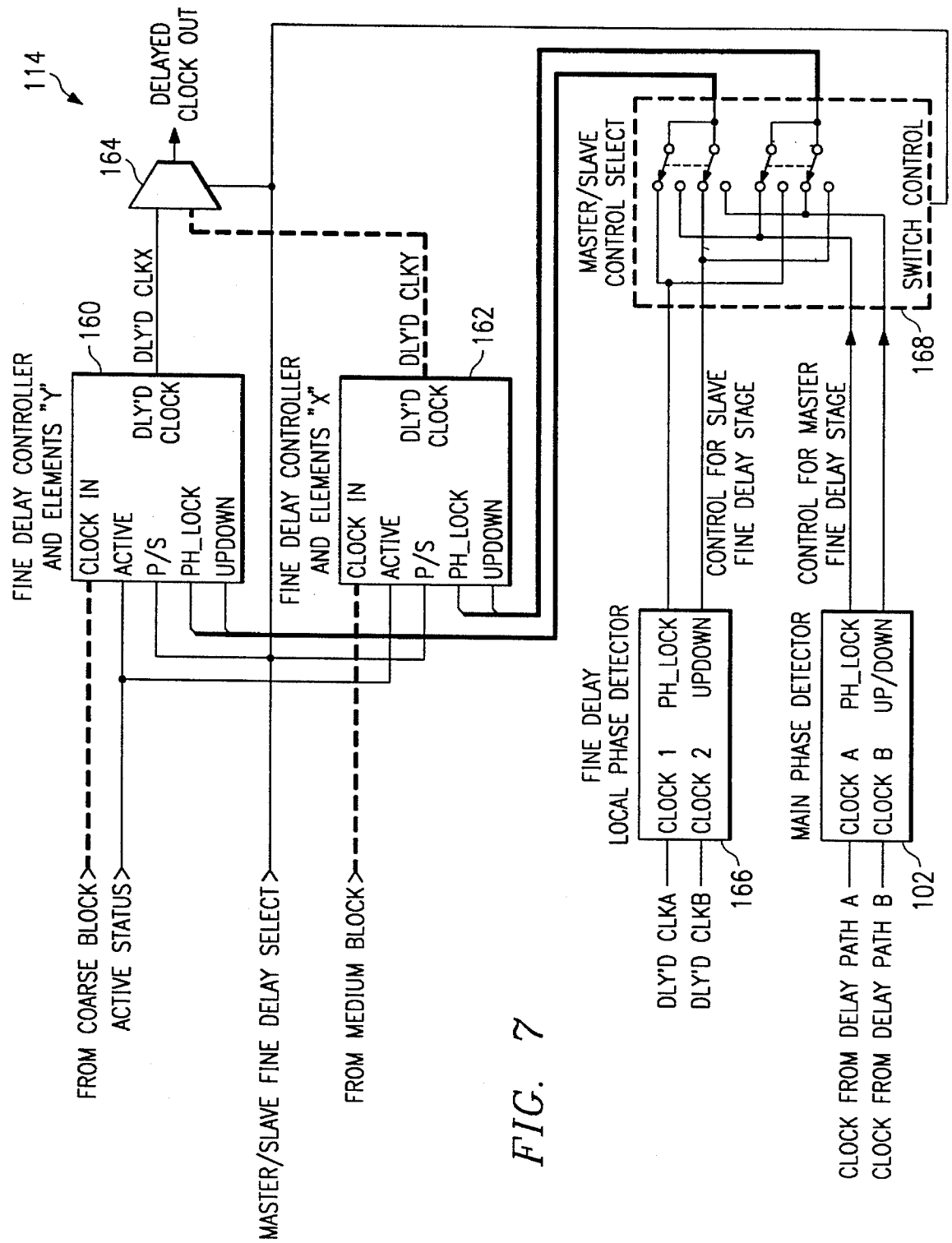
FIG. 7 is a more detailed block diagram of an embodiment of a fine delay stage.

Fine delay stage 114, having more complexity than coarse and medium delay stages 110 and 112, is shown in FIG. 7. Fine delay stage 114 includes two delay element blocks 160 and 162, receiving the delayed clock output from coarse delay stage 110 and medium delay stage 112, respectively. Control signals, PHASE LOCK and UP/DOWN, from either a local phase detector 166 or main phase detector 102, are provided to fine delay element blocks 160 and 162 through a switch 168. Switch 168 is controlled by the master/slave fine delay select signal, which also controls an output multiplexer 164 outputting the delayed master clock.

Figure 8:
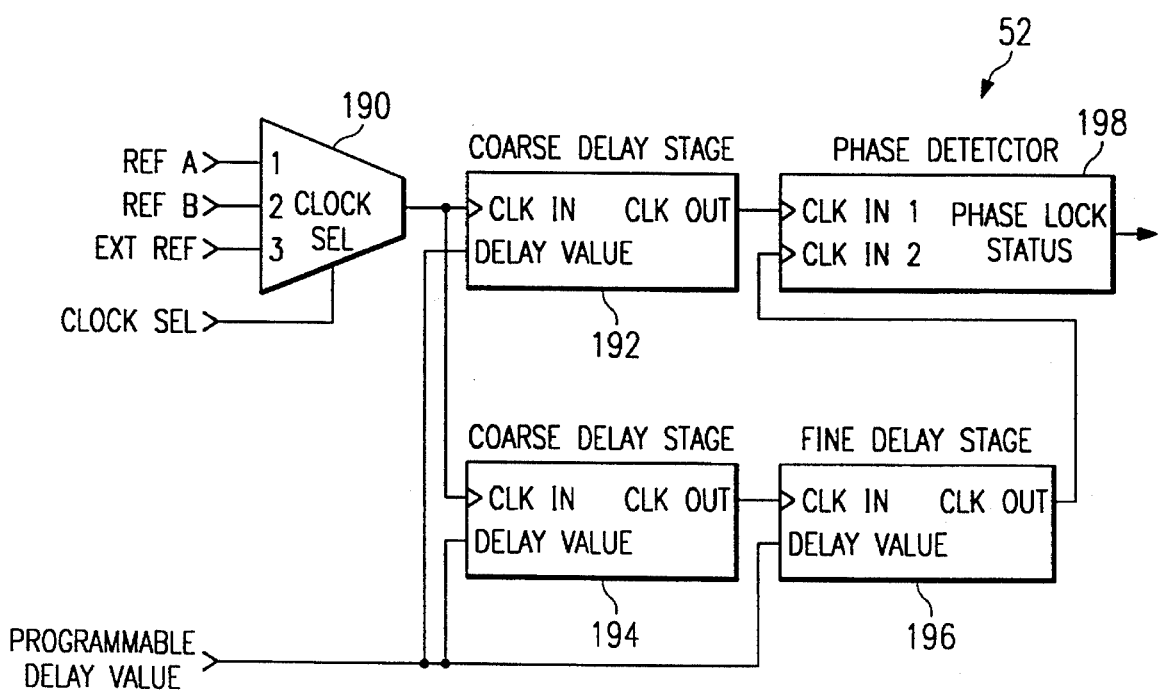
FIG. 8 is a simplified block diagram of an embodiment of a temperature compensation circuit.

FIG. 8 is a functional block diagram of temperature compensation circuitry 52. A three input multiplexer 190 receives and selects from CLOCK A, CLOCK B, and an external reference source the clock reference for temperature compensation. The output of multiplexer 190 is provided to a coarse delay stage 192, the output of which is supplied to one clock input of a local phase detector 198. The output of multiplexer 190 is further provided to a second coarse delay stage 194, whose output is supplied to a fine delay stage 196. The output of fine delay stage 196 is provided as the second clock input to local phase detector 198. Therefore, two delay paths are created, one including a coarse delay stage 192, and one including both a coarse and a fine delay stage 194 and 196. The output of local phase detector 198 includes phase lock status signals, such as UP/DOWN and PHASE LOCK, which are provided to a microprocessor 200 for storage and/or computation.

Figure 9:
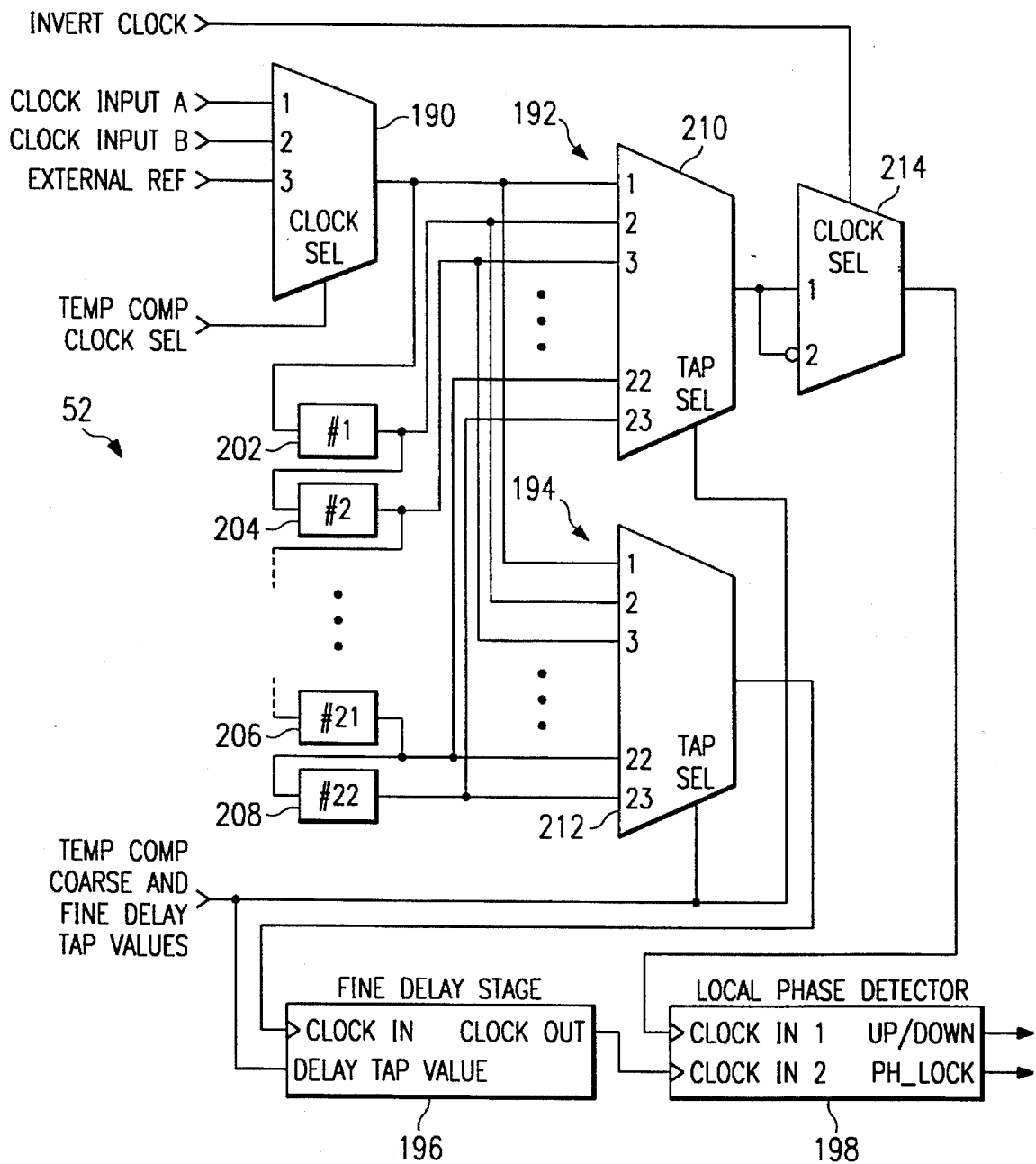
FIG. 9 is a more detailed block diagram of an embodiment of the temperature compensation circuit.

Referring to FIG. 9, temperature compensation circuitry 52 is shown in more detail. An array of delay elements 202–208 are coupled to first and second output multiplexers 210 and 212. The output of first multiplexer 210 is coupled to a first input of local phase detector 198 and the output of second multiplexer 212 is coupled to the second input of phase detector 198 to form the two delay paths. Fine delay stage 196 also includes an array of delay elements (not shown), coupled in a similar manner as medium delay stage 112 in FIG. 6. The output of local phase detector 198 is provided to a microprocessor (FIG. 8) for control and computation purposes.

Figure 10:
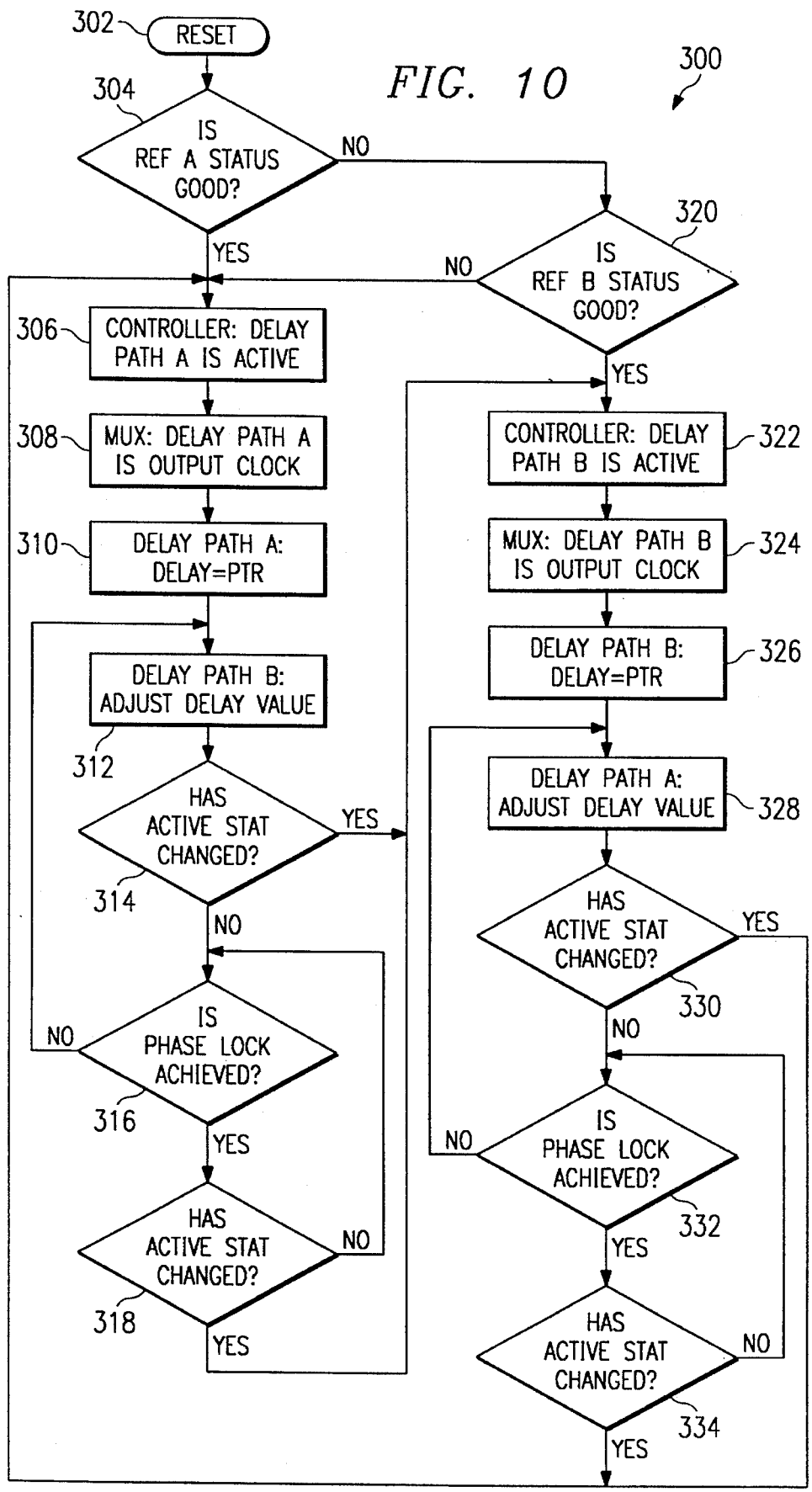
FIG. 10 is a simplified top level flow chart of an embodiment of the clock alignment process.

Referring to FIG. 10, a simplified flow chart 300 shows the basic clock alignment logic and sequence. Upon power up or reset, as shown in block 302, the status of CLOCK A is checked. If CLOCK A is error free, then its corresponding delay path, delay path A, is deemed active, and CLOCK A is selected by providing the appropriate select signal to active clock multiplexer 100 (FIG. 3) to output it as the ACTIVE CLOCK, as shown in blocks 306 and 308. Additionally, the same delay path is programmed to introduce a predetermined amount of delay. As shown in block 310, the predetermined delay amount may be a preferred setting stored in a register, the preferred tap register or PTR. The preferred delay amount provides a fixed reference point to minimize phase wander when switching between the two clock references is performed. The preferred delay amount for the fine delay stage may be a point at or near the center of the fine delay range and the preferred delay amount for the coarse stage is near the minimum of its range. Accordingly, the active delay path acquires the registered delay value (PTR), while the inactive delay path, delay path B in this instance, is set to align the INACTIVE CLOCK to the ACTIVE CLOCK.

The alignment process uses control signals from main phase detector 102 to adjust the delay value until INACTIVE CLOCK is phase-locked onto the ACTIVE CLOCK, as shown in block 312 and 316. Coarse alignment may be achieved by increasing the amount of delay in the inactive delay path incrementally until a change in phase relationship occurs and then backing up the amount of delay by one incremental amount. A change in phase relationship may be from a leading phase relationship to a lagging phase relationship. Fine delay alignment may be achieved by adjusting the delay amount until an initial phase lock, and continuing the delay adjustment in the same direction until the clock signals are again out of alignment. The delay value for the path is then determined to be the mean value between the in-lock and out-of-lock delay values. This fine delay alignment operation should be performed with a "balanced" phase detector.

To provide more precise phase alignment, it may be preferable to provide a delay path with delay elements of varying resolution, where alignment is realized by successively aligning the reference clocks in increasingly finer resolution. Meanwhile, checks on the active status of the reference clocks are made, as shown in blocks 314 and 318, to determine whether a clock reference switch is necessary. A reference switch is performed when one timing signal incurs an error condition or when such a switch is desirable to perform system diagnostic, maintenance and/or repairs.

If CLOCK A was not error free initially, as determined in block 304, or if the active status of the reference clocks has changed, as determined in blocks 314 and 318, then CLOCK B becomes the ACTIVE CLOCK. As shown in blocks 322–326, delay path B is then selected labeled as the ACTIVE path, the output clock is selected as the output of delay path B, and delay path B is set to the delay value in the preferred tap register (PTR). CLOCK A, now the inactive reference clock, is required to track and lock onto the phase of CLOCK B, as shown in blocks 328 and 332. The active status of the reference clocks are also checked during this operation, as shown in blocks 330 and 334.

It may be noted that after the ACTIVE delay path is set to the preferred tap value, as shown in blocks 310 and 326, the propagation delay of the INACTIVE delay path tracks and is aligned with the ACTIVE CLOCK. To achieve phase lock, delay stages 110–114 (FIG. 4) may be enabled in progression from coarse to fine until the two delay path outputs are in phase-lock. Alternatively, it may be desirable to use selected delay stages such as only coarse and fine delay stages 110 and 114 to achieve phase alignment.

Figure 11A:
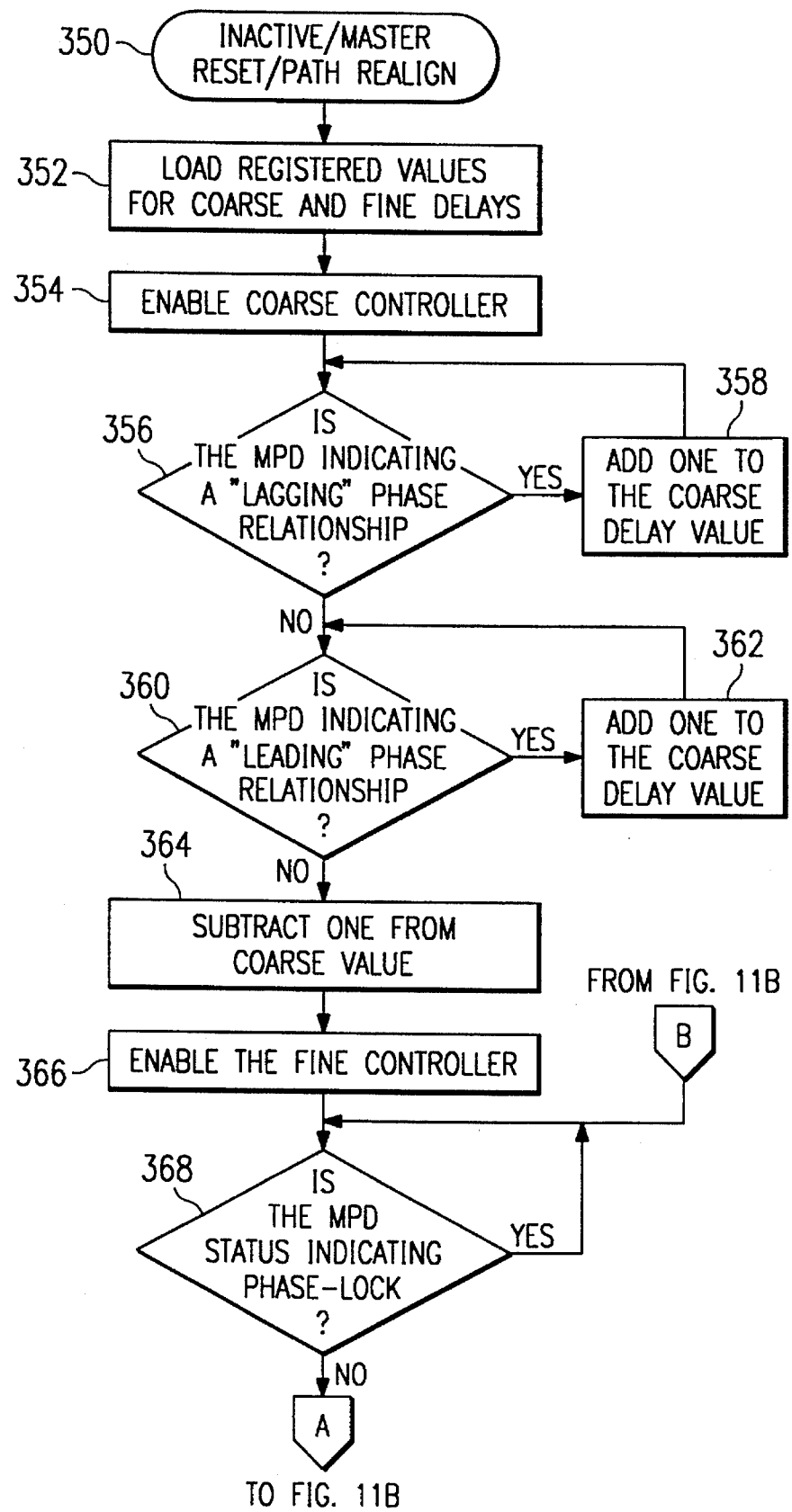
FIGS. 11A and 11B show a flow chart of an embodiment of the operations of the INACTIVE/master portion of the clock alignment circuit.
Figure 11B:
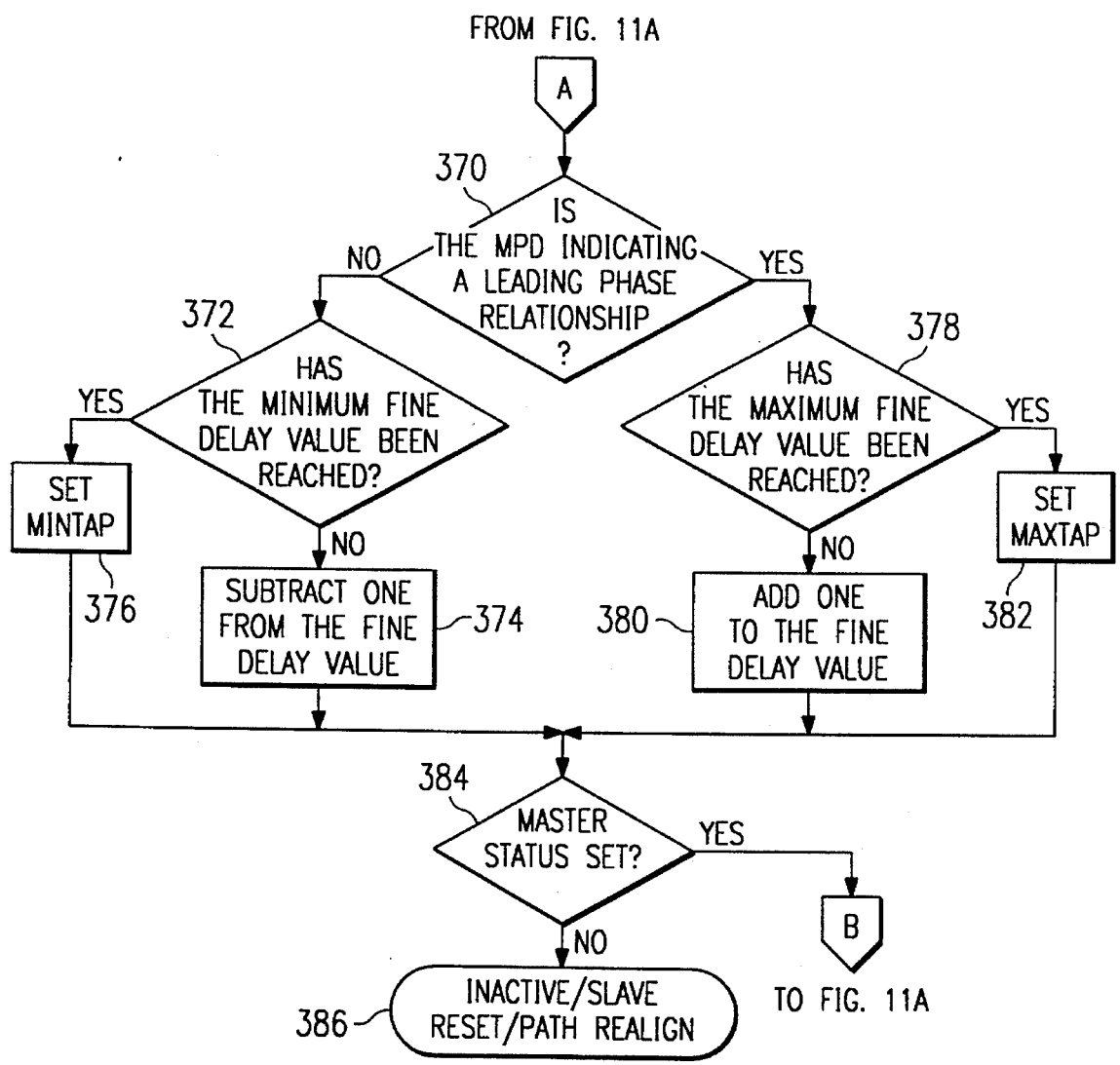

As shown in FIG. 4, master and slave delay paths are provided in delay circuitry 46 and 48. FIGS. 11A and 11B show the reset and path alignment operation 350 of the master path portion of the INACTIVE delay path. As discussed briefly above, the clock signal on the INACTIVE delay path is aligned with the clock signal on the ACTIVE delay path. In particular, the clock signal on the master portion of the INACTIVE delay path is aligned with the signal on the ACTIVE delay path, and the slave portion of the INACTIVE path tracks and is aligned with the signal on the master path. The use of master and slave path portions provides a virtually unlimited delay range for phase alignment.

In block 352, coarse and fine delay stages 110 and 114 of the master path are initialized with delay values stored in appropriate registers (not shown). Coarse delay controller 134 (FIG. 5) is enabled, as shown in block 354. The output from main phase detector (MPD) 102 (FIG. 3) is checked to see if a lagging phase relationship exists between the two reference signals, as shown in block 356. If so, the coarse delay value is incremented by one to the next coarse delay value, as shown in block 358. The phase relationship status check in block 356 and coarse delay increment in block 358 are repeated until the INACTIVE CLOCK signal is no longer lagging the ACTIVE CLOCK signal. The main phase detector 102 output is then checked to see if the INACTIVE CLOCK signal is now leading the ACTIVE CLOCK signal, as shown in block 360. This change in phase relationship is indicated by the UP/DOWN output from fine delay stage 114, shown as DELAY CONTROL in FIG. 4.

If the INACTIVE CLOCK signal leads the ACTIVE CLOCK, the coarse delay is incremented, as shown in block 362. The coarse delay is incremented until the INACTIVE CLOCK signal is no longer leading the ACTIVE CLOCK signal, at which time coarse delay is decremented by one, as shown in block 364. These steps in effect delays an edge of the INACTIVE CLOCK until it crosses an edge of the ACTIVE CLOCK signal. Step 364 backs the INACTIVE CLOCK edge up so that it occurs immediately before the ACTIVE CLOCK edge, where the addition of fine delays may delay the INACTIVE CLOCK edge in finer resolutions to more accurately align the two clock edges.

In blocks 366 and 368, fine delay controller 160 or 162 (FIG. 7) of the master path portion is enabled and the output of main phase detector 102 (FIG. 3) is checked to determine if the signals on the master path portions of the INACTIVE and the ACTIVE delay paths are in phase alignment. If the clock are aligned, the output of main phase detector 102 is checked continuously until the clocks are no longer in alignment, at which time the phase relationship between the clocks is determined in block 370. If the INACTIVE CLOCK edge is not leading the ACTIVE CLOCK edge, then the delay value of the INACTIVE delay path should be decreased. Therefore, the delay value is decremented after a determination that minimum fine delay value has not been reached, as shown in blocks 372 and 374. If the minimum fine delay value has been reached, then a MINTAP variable is set to so indicate.

If, in block 370, it is determined that the INACTIVE CLOCK edge is leading the ACTIVE CLOCK edge, then the INACTIVE path requires more delay. The delay value is incremented after a determination that maximum fine delay value has not been reached, as shown in blocks 378 and 380. If the maximum fine delay has been reached, a MAXTAP variable is set, as shown in block 382. Finally, a check is made on the master status of the path. If the status variable is still set, then execution loops back to block 368 to check for phase alignment, else execution is changed to the INACTIVE/slave phase alignment algorithm, a flow chart of which is shown in FIG. 12.

Figure 12:
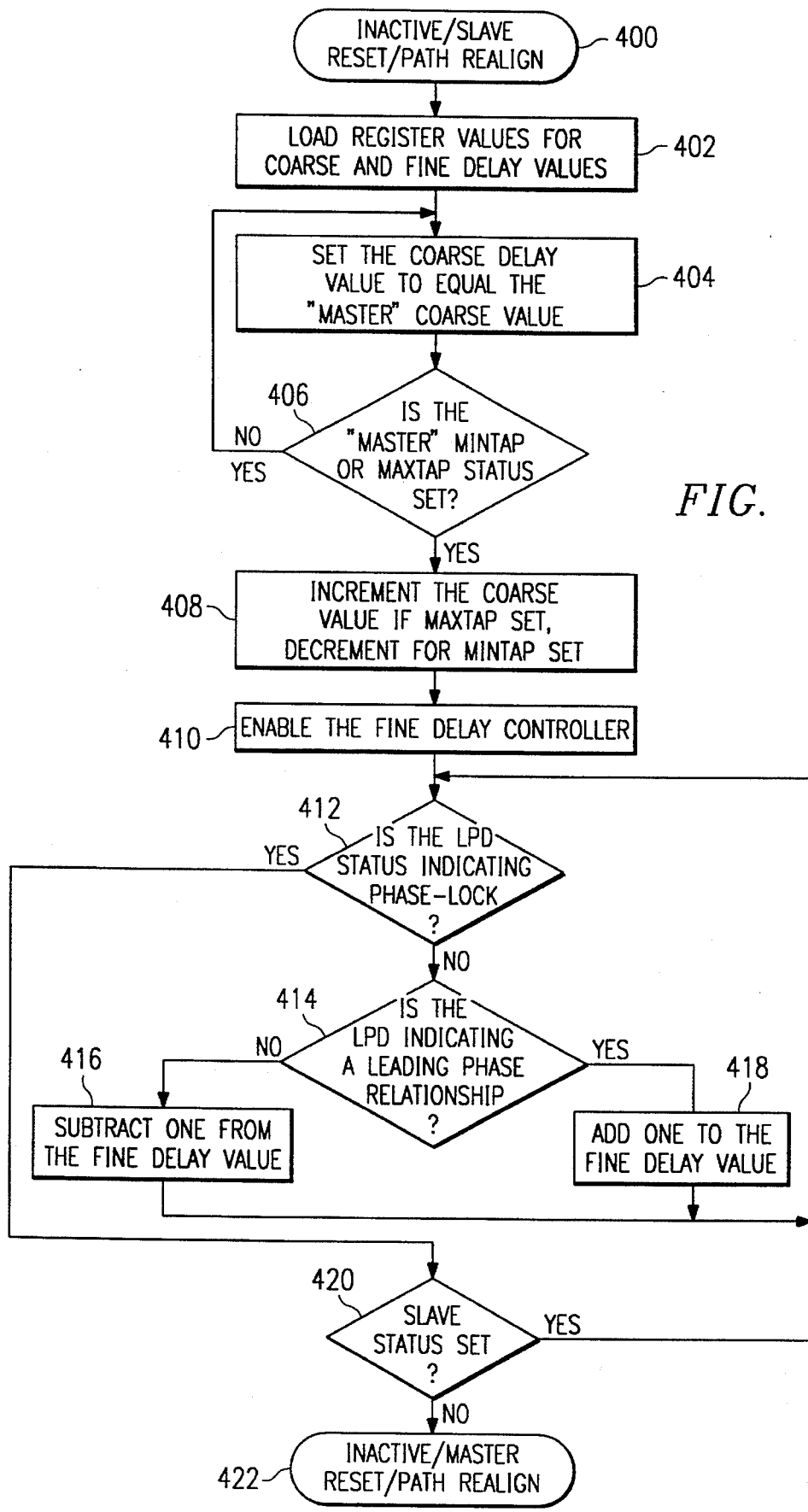
FIG. 12 is a flow chart of an embodiment of the operations of the INACTIVE/slave portion of the clock alignment circuit.

Referring to FIG. 12, the control and logic flow 400 of the slave path portion of the INACTIVE delay path is shown. The slave path portion of the INACTIVE delay path is generally controlled to follow and be aligned with the master portion of the delay path. In block 402, coarse and fine delay stages 110 and 114 of the slave path portion are initialized with registered delay values. The coarse delay value is then set to equal to the coarse delay value of the master path portion, as shown in block 404. A determination is then made in block 406 as to whether the master MINTAP or MAXTAP status variables is set, which indicate that the fine delay stage of the master path is set at its minimum or maximum delay value. If neither is set, then execution loops back to block 404, else the coarse delay value is incremented if MAXTAP is set or decremented if MINTAP is set, as shown in block 408.

The fine delay controller 160 or 162 of the slave path is then enabled, as shown in block 410, to begin alignment. The status outputs from local phase detector (LPD) 166 (FIG. 7) is then checked to determine whether the slave path signal is aligned with the master path signal, as shown in block 412. If the clocks are not aligned, then the phase relationship between the clocks are determined in block 414. If the slave path signal is lagging the master path signal, then the fine delay value is decremented, as shown in block 416. On the other hand, if the slave path signal is leading the master path signal, then the fine delay value is incremented, as shown in block 418. The fine delay value is adjusted in this manner until it is determined in block 412 that the clock edges are in alignment, at which time execution proceeds to block 420 where the master or slave status of the path portion is checked. If the slave status of the path is unchanged, then execution loops back to block 412, else the path portion becomes the master path portion.

Figure 13:
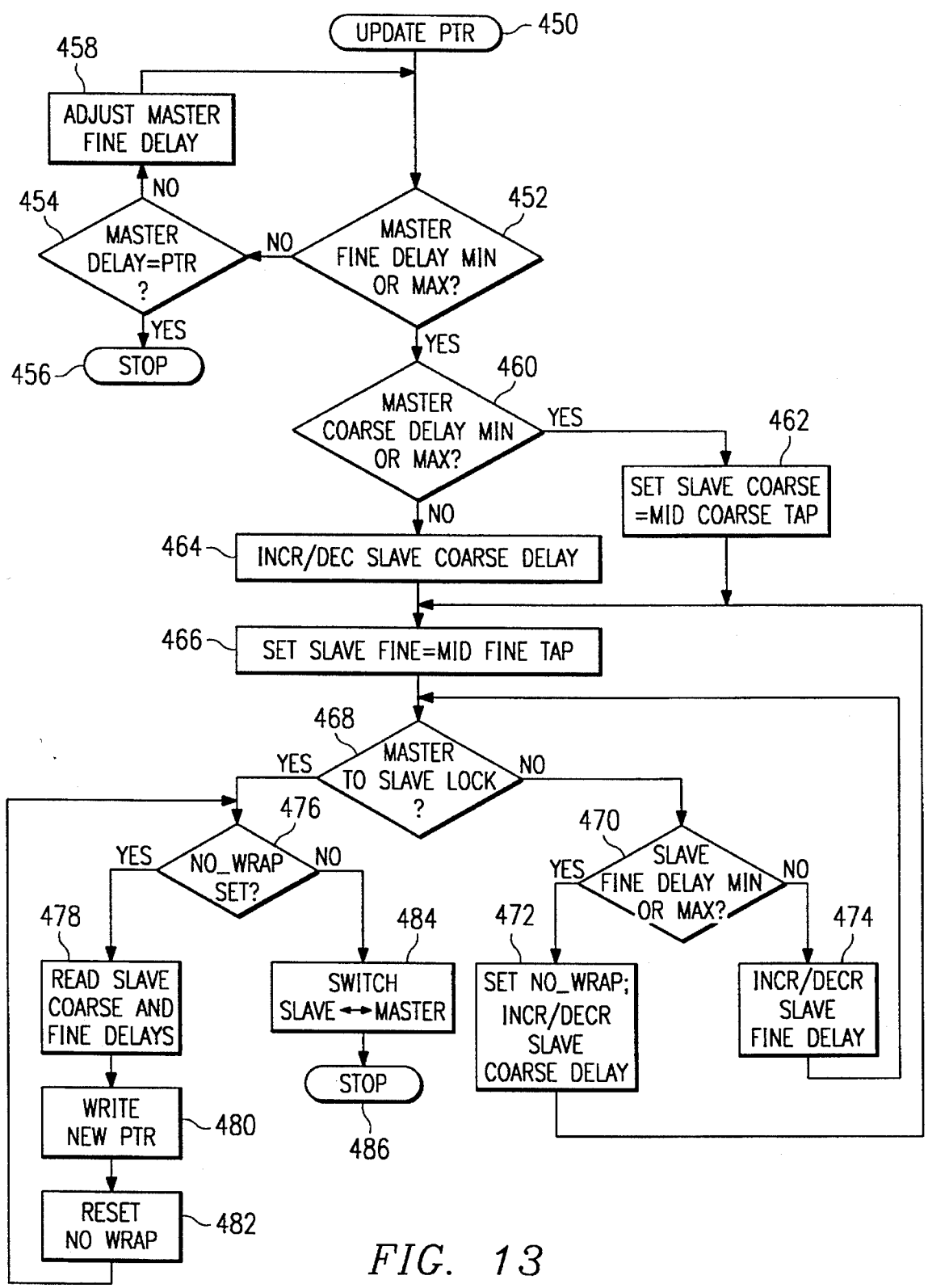
FIG. 13 is a flow chart of an embodiment of the wrap operations of the ACTIVE portion of the clock alignment circuit.

Referring to FIG. 13, an update preferred tap register (PTR) 450 algorithm is shown. The preferred tap registered delay values may be updated or changed when operating conditions changes the delay characteristics of the delay paths, such as when temperature variations affect the effective delay of the delay paths. In block 452, a determination is made as to whether the master fine delay of the ACTIVE delay path has reached its maximum or minimum. If the master fine delay is not at the maximum or minimum and it is equal to the preferred tap register values, then nothing more needs to be done, as shown in blocks 454 and 456. If the master delay is not at the preferred tap register values, then the fine delay is adjusted to achieve alignment, as shown in block 458, and execution loops back to block 452. If the master fine delay has reached the maximum or minimum, then the master coarse delay is checked to determine whether it has reached its maximum or minimum, as shown in block 460. If the master coarse delay maximum or minimum is reached, then the slave coarse delay is set to equal to a predetermined tap position. As shown in block 462, the coarse delay is set to equal a value which provides a delay at the middle of the coarse delay range. If the master coarse delay is not at a maximum or minimum, then the slave coarse delay is incremented if the fine delay is at a maximum, or the slave coarse delay is decremented if the fine delay is at a minimum, as shown in block 464.

In block 466, the slave fine delay is also set to a mid tap position. A determination is then made as to whether the slave clock is aligned with the master clock in block 468. If there is no alignment, then if the slave fine delay is at a maximum or minimum, the slave coarse delay value is either incremented or decremented, as shown in blocks 470 and 472. The slave coarse delay value is incremented if the fine delay is at a maximum. On the other hand, the slave coarse delay value is decremented if the fine delay is at a minimum. If the determination in block 470 is such that the slave fine delay is not at a minimum or maximum, then the NO_WRAP variable is set and the slave fine delay is either incremented or decremented to achieve phase lock based on the lock status output of fine delay local phase detector 166. The steps in blocks 470–474 are repeated until the clock signal on the slave path portion is aligned with the signal on the master path portion. At this time, if the NO_WRAP variable is set, as determined in block 476, then the slave path delay values are read and written into the preferred tap register, and the NO_WRAP variable is reset, as shown in blocks 478–482. In block 484, the master and slave path portions are then switched, i.e., the path portion that was the slave is now the master, and the path portion that was the master is now the slave. The algorithm ends in block 486.

Operating in this manner, a virtually unlimited amount of delay is available for the ACTIVE CLOCK path to compensate for changes in propagation delay, and the INACTIVE CLOCK path has a virtually unlimited delay range to track the ACTIVE CLOCK. Note that when the master coarse and fine delays reached their maximum or minimum, the slave coarse and fine delays are set to the middle of their range so that a new clock edge may be located for phase alignment. Once phase lock is achieved, the slave and master paths are then switched so that the master path is no longer at its maximum or minimum delays.

Figure 14:
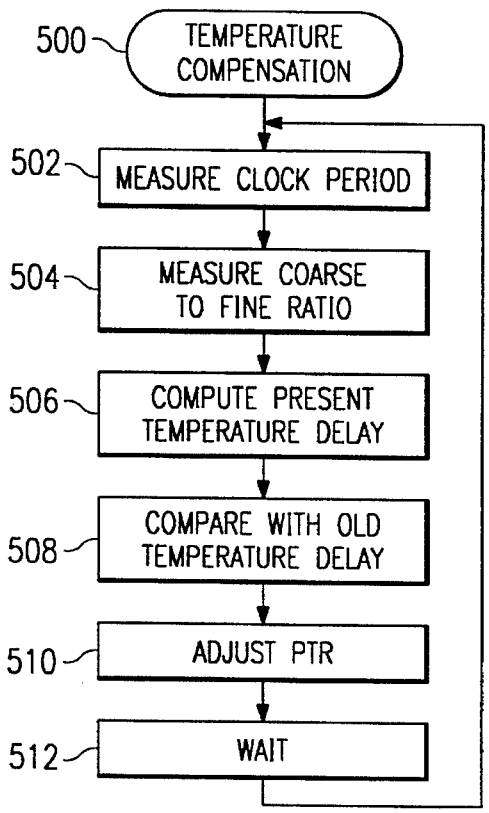
FIG. 14 is a flow chart of an embodiment of the temperature compensation process.

As discussed above, the preferred tap register values may be updated to compensate for changes in the delay characteristics in the delay paths due to process, temperature and voltage variations. In general, as temperature rises, the effective delay of delay elements in the delay paths increases in value. Likewise, as temperature falls, the effective delay of the delay elements decreases in value. This is especially true of CMOS devices. FIG. 14 shows a top level flow chart for temperature compensation 500. Temperature compensation is performed by first measuring one clock period in terms of the delay elements in the temperature compensation circuitry delay paths, as shown in block 502. This measurement may be in terms of coarse and fine delay resolutions. Next, the number of fine delay per coarse delay is determined, as shown in block 504. With these two measurements, the number of fine delays per clock period may then be determined, as shown in block 506 and the following equation:

$$\text{TEMP DELAY} = (\text{CLOCK PERIOD COARSE})\left(\frac{\text{FINE}}{\text{COARSE}}\right) + \quad (1)$$

$$(\text{CLOCK PERIOD FINE})$$

This temperature measurement is then compared with the same measurement performed previously, as shown in block 508. The comparison may yield a ratio indicative of the relative delay change per fine delay element:

$$\Delta \text{ TEMP DELAY} = \frac{\text{PRESENT TEMP DELAY}}{\text{PREVIOUS TEMP DELAY}} \quad (2)$$

If the relative delay change is greater than one, then more delay elements are required to delay the reference clock one period than previously. This indicates that the delay per fine delay element has decreased due to temperature variations. On the other hand, if the ratio is less than one, then less delay were used to delay the reference clock one period than previously, which is indicative of an increase of delay per delay element. With this information, the preferred tap register settings may be adjusted to compensate for this change, as shown in block 510:

$$\left[(PTR\text{ COARSE})\left(\frac{\text{FINE}}{\text{COARSE}}\right) + \quad (3)\right.$$

$$\left.(PTR\text{ FINE})\right](\Delta \text{ TEMP DELAY}) = \text{NEW } PTR$$

Equation (3) yields a preferred tap register value in fine delays, which may be easily converted to preferred tap register values for coarse and fine delays by using the number of fine delay per coarse delay value. In block 512, a wait period of a predetermined length is observed before temperature compensation is repeated. Under typical operating conditions and temperature change, a wait period of approximately one minute is appropriate.

Figure 15:
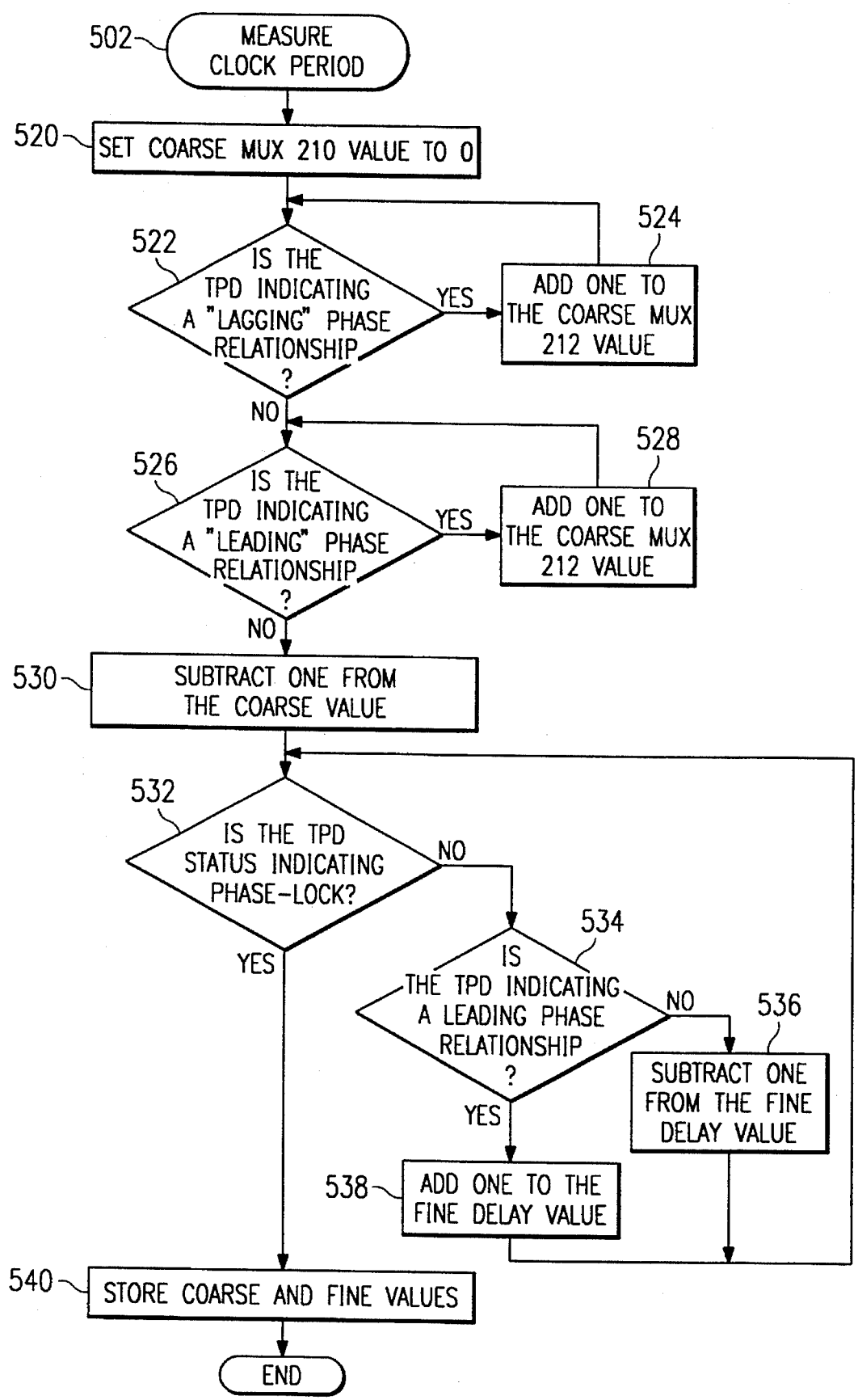
FIG. 15 is a flow chart of an embodiment of the clock period measurement process of the temperature compensation circuit.

Referring to FIG. 15 and also consulting FIG. 9, the steps of measuring one clock period of the ACTIVE CLOCK by temperature compensation circuit 52 is described. In block 520, coarse multiplexer 210 is set so that the resultant signal therefrom incurs no delay. This step effectively zeros out the amount of delay in the delay path having only coarse delay stage 192, hereinafter referred to as the first delay path. Thereafter the delay in the second delay path through coarse delay stage 194 is adjusted to first find a clock edge and then to achieve alignment. In block 522, the phase lock status output of local temperature phase detector 198 is checked to determine whether the second path signal lags the first path signal. If so, the second path coarse delay is incremented, as shown in block 524. The second path coarse delay is incremented in this manner until the second path signal no longer lags the first path signal. If the second path signal now leads the first path signal, as indicated in block 526, then the second path coarse delay is still incremented until it no longer leads the first path signal. At this time, the two clock signals are within one coarse delay apart from phase alignment. The coarse delay of the second path is then decremented by one to place its clock edge in front of the first path clock edge, as shown in block 530. Fine delays may now be added to achieve phase alignment.

Local temperature phase detector 532 outputs are checked to determine whether phase lock has been achieved, as shown in block 532. If the signals are not in phase alignment, then the second path fine delay is incremented or decremented depending on the phase relationship between the first and second path signals, as shown in blocks 534538. The fine delay element is adjusted in this manner until block 532 finds the two signals in phase alignment. The second path coarse and fine delay values, which represent the amount of delay necessary to delay the reference clock one clock period, are then stored, as shown in block 540.

Figure 16:
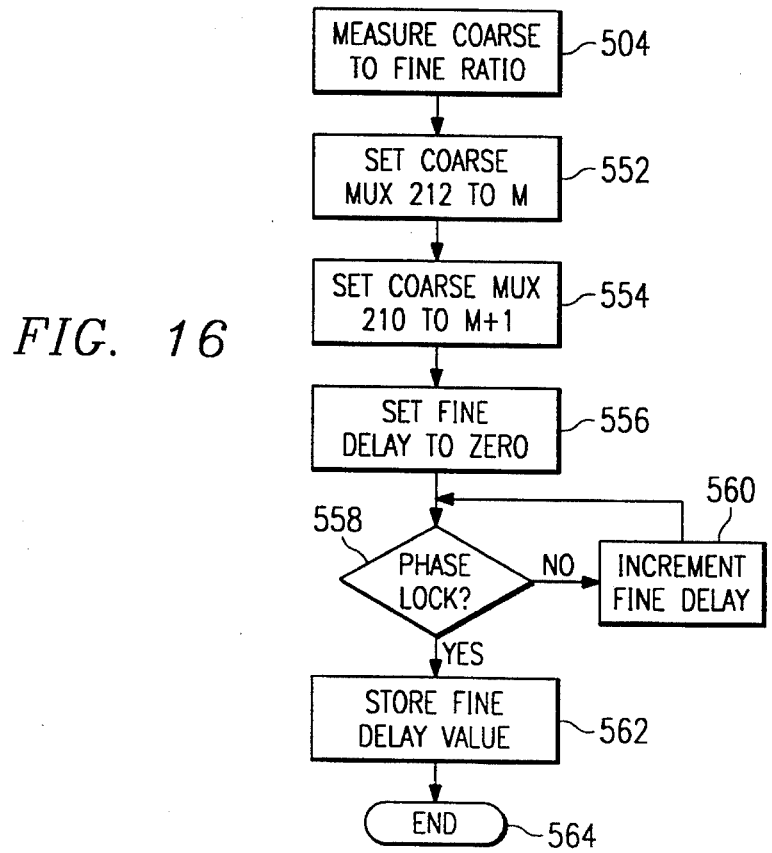
FIG. 16 is a flow chart of an embodiment of a coarse to fine delay ratio measurement process.

FIG. 16 is a flow chart showing the coarse to fine ratio measurement 504. Referring also to FIG. 9, coarse multiplexer 212 is set to a delay value M, and coarse multiplexer 210 is set to a delay value of M +1, as shown in blocks 552 and 554. Coarse delay 192 is therefore one delay less than coarse delay 194. Fine delay 196 is then initialized to zero, and incremented until a phase alignment between the first path signal and the second path signal, as shown in blocks 556–560. When phase alignment is achieved, the fine delay value of fine delay stage 196 represents the number of fine delays equalling one coarse delay. This value is stored as a conversion factor for temperature delay computation, as shown in block 562. The algorithm ends in block 564.

Figure 17:
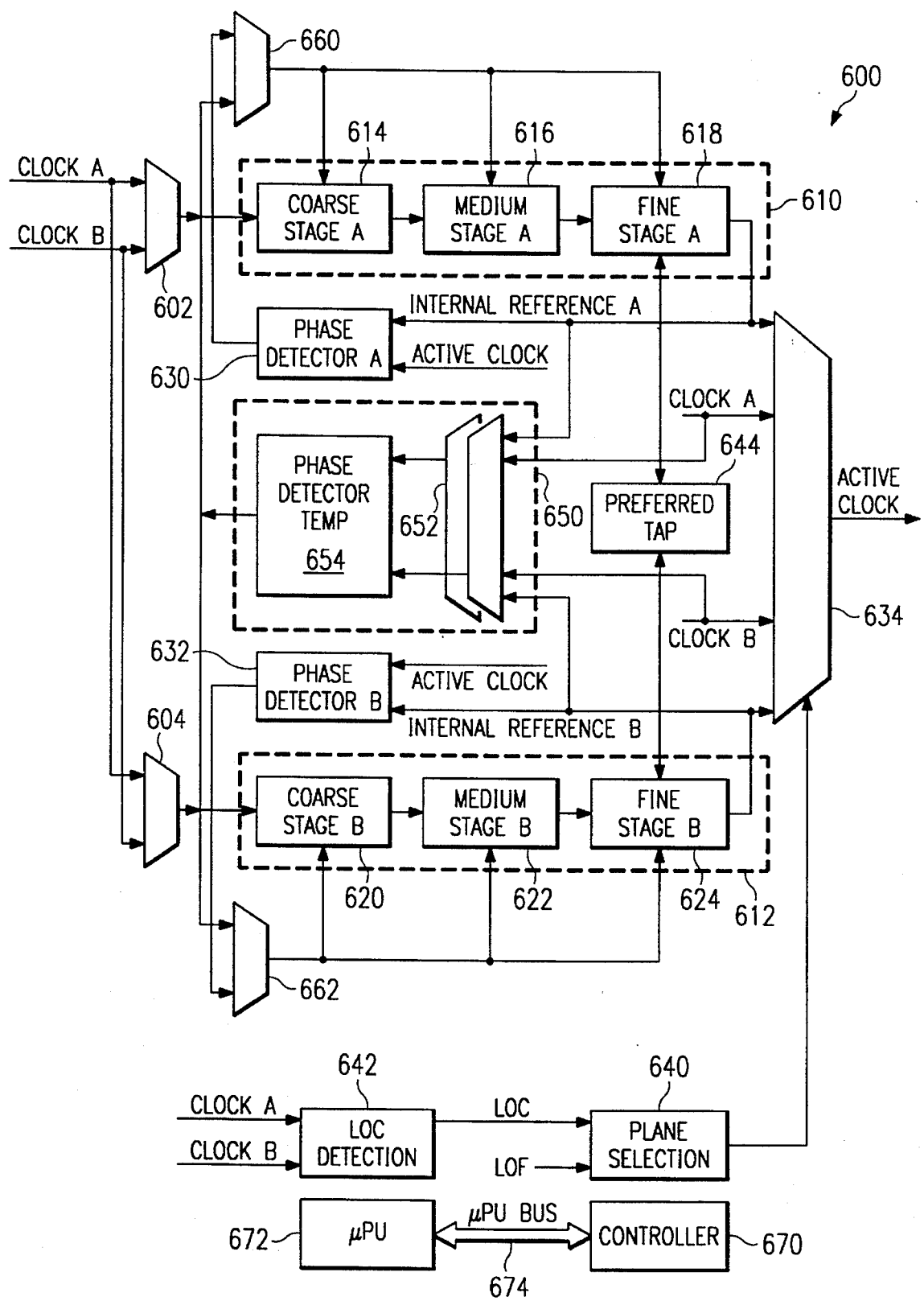
FIG. 17 is a simplified block diagram of another embodiment of the clock alignment circuit.

FIG. 17 shows another preferred embodiment of the clock alignment and switching circuitry 600 with PTV compensation. Redundant reference clocks A and B are received by delay source multiplexers 602 and 604 for distributing the reference clocks down first and second delay paths A and B 610 and 612. Each delay path A and B 610 and 612 may include concatenated coarse, medium and fine stages 614–624 providing varying incremental delay amounts, such as those described above. The output of delay paths A and B 610 and 612, INTERNAL REFERENCE A and INTERNAL REFERENCE B, are provided to respective phase detectors A and B 630 and 632. INTERNAL REFERENCE A and INTERNAL REFERENCE B are also provided to an output multiplexer 634, which may be controlled to select from reference CLOCK A and CLOCK B, and INTERNAL REFERENCE A and INTERNAL REFERENCE B, the active output clock signal. Output multiplexer 634 is controlled by a plane selection circuitry 640, which selects as the active clock one of the reference clock signals, either delayed or undelayed. A preferred tap register 644 is coupled to fine delay stages 618 and 624 to generate preferred delay amounts.

A temperature compensation circuit 650 includes multiplexers 652, which selects, from the reference clock and internal reference pairs A and B, one pair to be provided to a temperature phase detector 654. The outputs of temperature phase detector 654 is provided to multiplexers 660 and 662, which select and route the temperature phase detector 654 outputs and outputs from phase detectors 630 and 632 to appropriate delay paths A and B 610 and 612 as control signals. Constructed in this manner, temperature compensation circuit 650 does not require a dedicated delay path to perform the various measurements, but uses the inactive one of delay paths A and B 610 and 612 for this purpose. Multiplexers 602, 604, 652, 660, and 662 are controlled by a controller 670, which may receive control and status signals from a microprocessor 672 through a bus 674.

After system reset, both delay paths A and B 610 and 612 are initialized to the same predetermined amount of delay. Coarse stages 614 and 620 may be set to zero, and medium and fine delay stages 616, 618, 622, and 624 may all be set to a mid point of their respective delay ranges. CLOCK A and CLOCK B are selected and fed through multiplexers 602 and 604 to delay paths A and B, respectively. CLOCK A may be selected as the ACTIVE CLOCK by default, or fault conditions may cause plane selection circuitry 640 to select the errorless reference clock as the ACTIVE CLOCK.

For ease of discussion, let CLOCK A be the ACTIVE CLOCK, which is passed through delay path A 610. CLOCK B is passed through delay path B 612. Phase detector B 632 detects the phase relationship between the ACTIVE CLOCK and INTERNAL REFERENCE B so that it may generate phase alignment status signals to control the amount of delay in each stage of delay path B 612. Operating in this manner, INTERNAL REFERENCE B tracks and is aligned with the ACTIVE CLOCK.

If plane selection circuitry 640 instructs clock alignment and switching circuitry 600 to switch the reference clock signals, CLOCK B becomes the ACTIVE CLOCK, and INTERNAL REFERENCE A is aligned with the ACTIVE CLOCK.

Periodically, the temperature compensation procedure is performed to detect the effects of changing temperature on the performance of delay paths 610 and 612. The inactive delay path, in this instance delay path B 612, is temporarily borrowed from the phase alignment process to be used to measure one clock period and the number of fine delays per coarse delay, as discussed above. This is achieved by selecting the output from temperature phase detector 650 instead of phase detector B 632 as the control signals to delay path B 612. The measurements obtained are then used to compute the amount of change in delay tap settings to compensate for the change due to temperature as discussed above.

Figure 18:
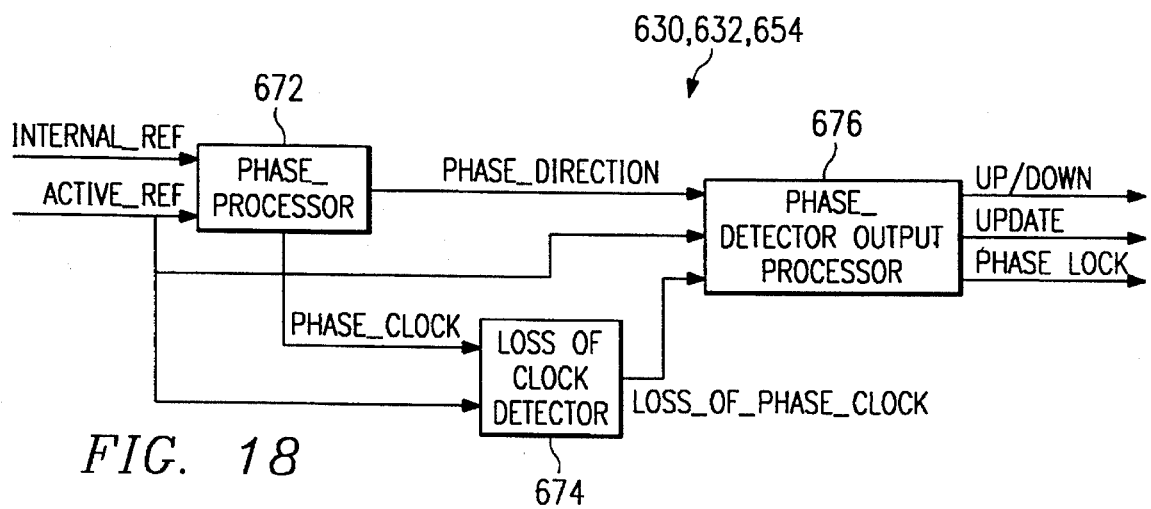
FIG. 18 is a block diagram of an embodiment of the phase detector.

One key component in achieving the sub nanosecond requirement for phase alignment is the implementation of phase detectors 630, 632, and 654. Referring to FIG. 18, a six cycle phase detector is implemented to determine the phase position of the internal plane reference relative to the active reference. Phase detectors 630, 632, and 654 consist of a phase processor 672, a loss of clock (LOC) detector 674, and an output processor 676.

Phase processor 672 samples every pair of rising edges from the incoming clock references and determines the relative phase position between the internal plane reference and the active reference, i.e., whether the internal plane reference is leading or lagging the active reference. Phase processor 672 then produces a PHASE DIRECTION vector which has the encoded phase position information and a PHASE_CLOCK which indicates the absolute distance between the rising edge of the active reference and the rising edge of the internal plane reference. Phase processor 672 is described in more detail below in conjunction with FIG. 19.

Loss of clock detector 674 may be implemented with a 2-bit shift register (not shown) which is clocked by the active reference and reset by PHASE_CLOCK from phase processor 672. In the absence of PHASE_CLOCK to reset the shift register, a logic level one is shifted through the register. When a logic level one appears at the last bit of the shift register, a LOSS OF PHASE CLOCK condition is triggered which in turn will generate a PHASE LOCK condition, i.e., the internal plane is phase aligned to the active reference.

Phase detector output processor 676 is responsible for generating control signals for down stream delay path control circuits. Specifically, the UP/DOWN, UPDATE, and PHASE LOCK signals. The UP/DOWN signal is generated from the PHASE DIRECTION vector. For example, when the PHASE DIRECTION vector is "10" (the internal plane reference is leading the active reference), the UP/DOWN signal is set indicating that down stream delay path control circuits should add delay to the particular section of the delay line. When PHASE DIRECTION vector is "01" (the internal plane reference is lagging the active reference), the UP/DOWN signal is reset to indicate that down stream delay path control circuits should subtract delay from the particular section of the delay line. When PHASE DIRECTION vector is "00" or "11" the UP/DOWN signal retains its current state.

The UPDATE and PHASE LOCK signals may be generated by a six cycle state controller (not shown). For example, during certain states, the UPDATE signal is generated to instruct down stream delay path control circuits to update the particular section of the delay line according to the UP/DOWN signal. During another state, if the LOSS OF PHASE CLOCK condition is present, then the PHASE LOCK signal is set to instruct down stream delay path control circuits to discontinue processing because phase alignment has been achieved. Furthermore, if the PHASE LOCK signal is active, the state machine controller (not shown) and the UPDATE signal are deactivated and are held in their reset states.

Figure 19:
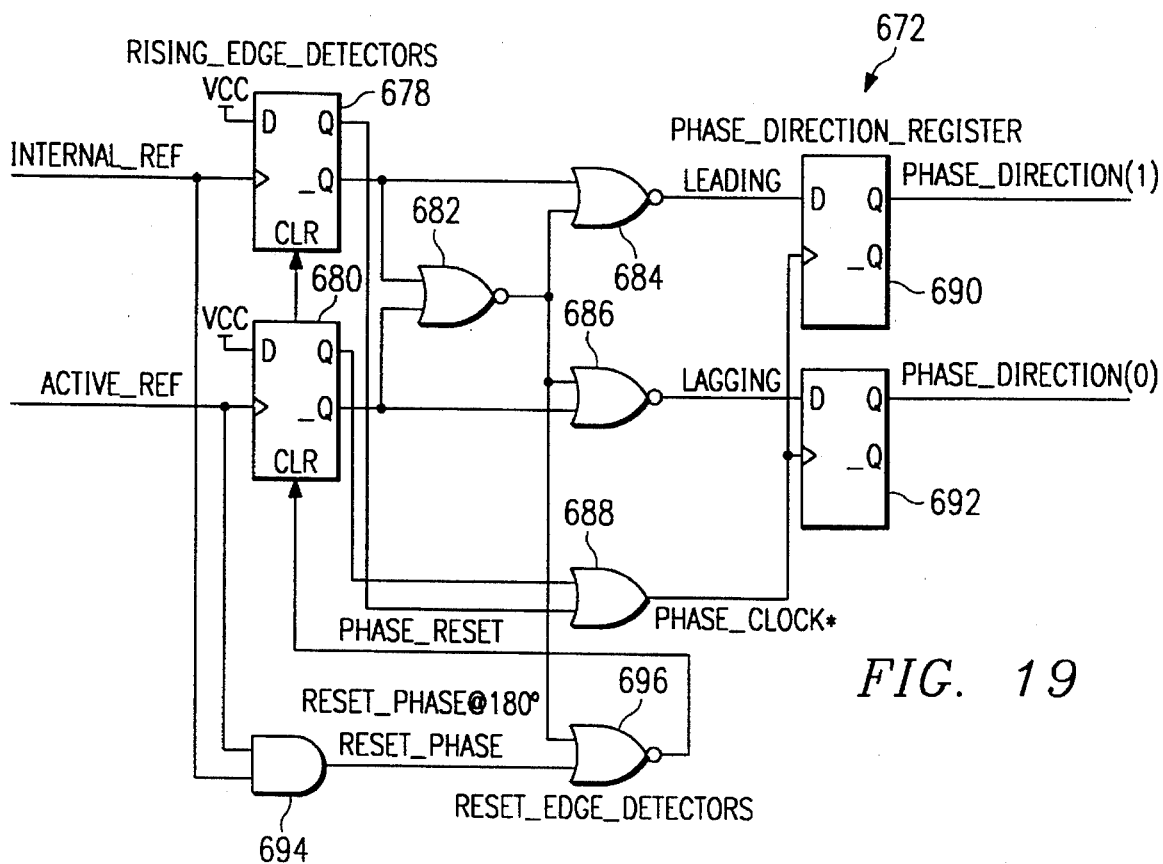
FIG. 19 is a block diagram of an embodiment of the phase processor of the phase detector.

Referring to FIG. 19, phase processor 672 includes a rising edge detector 678 and 680 for each timing reference, a trio of logic NOR gates 682–686 to process phase information, a direction register shown as D flip-flops 690 and 692 to hold the processed phase information, and a logic OR gate 688 to generate the PHASE_CLOCK signal. An AND gate 694 and a NOR gate 696 perform the reset function to rising edge detectors 678 and 680.

A timing reference rising edge is detected by clocking a logic level one through rising edge triggered D flip-flop 678 and 680. Once a rising edge has been detected, it is then processed to produce phase direction information and a PHASE_CLOCK to clock in and store the phase information. The phase information generated and registered conveys whether the internal reference is leading or lagging the active reference. If rising edge detector 678 triggers before rising edge detector 680, then the phase direction information indicates that the internal reference is leading the active reference. Likewise, if rising edge detector 680 triggers before rising edge detector 678, then the phase direction information indicates that the internal reference is lagging the active reference. In addition, a PHASE_CLOCK pulse is also produced when a rising edge detector triggered.

The rising edge of PHASE_CLOCK is derived from the detection of a rising edge from either reference. The falling edge of PHASE_CLOCK is produced by resetting both rising edge detectors 678 and 680. PHASE_CLOCK is important because its width is a precise measurement of the distance in time between the rising edges of the respective clock references. When the rising edges of the respective clock references become closer, the PHASE_CLOCK pulse becomes smaller, and eventually disappears because the propagation delay of OR gate 688 is greater than the pulse width of PHASE_CLOCK. When PHASE_CLOCK disappears, the respective clock references are considered in phase, i.e., they are as close as the propagation delay of OR gate 688 which is very much less than a nanosecond in an application specific integrated circuit design environment. Furthermore, PHASE_CLOCK may be sufficiently loaded capacitively to allow the phase information sufficient setup time to be properly registered by phase direction register 690 and 692.

Rising edge detectors 678 and 680 are reset by one of two ways: when the respective timing references have a phase relationship other than 180 degrees and when they do have a phase relationship of 180 degrees. When a non-180 degree phase relationship exists, rising edge detectors 678 and 680 are reset when both references are at a logic level one. When a 180 degree phase relationship exists, the first method of reset is rendered useless since AND gate 688 never generates a logic level one. Therefore when a 180 degree phase relationship exists, rising edge detectors 678 and 680 are reset when either edge detector triggers. It is important to note that the 180 degree reset signal must be sufficiently loaded capacitively so that it is not allowed to trigger during non 180 degree phase relationships.

Figure 20:
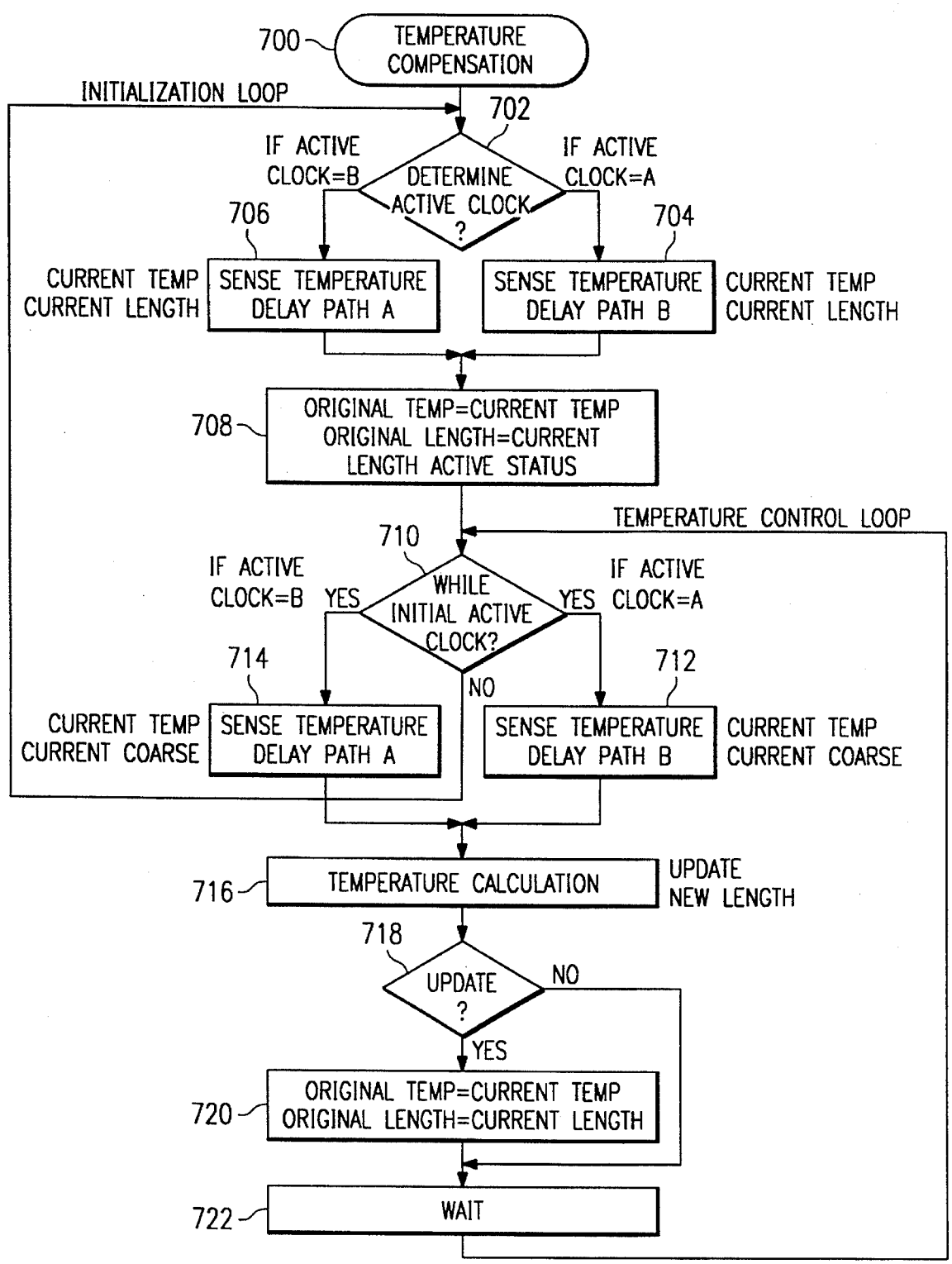
FIG. 20 is a flow chart of an embodiment of the temperature compensation control process.
Figure 21:
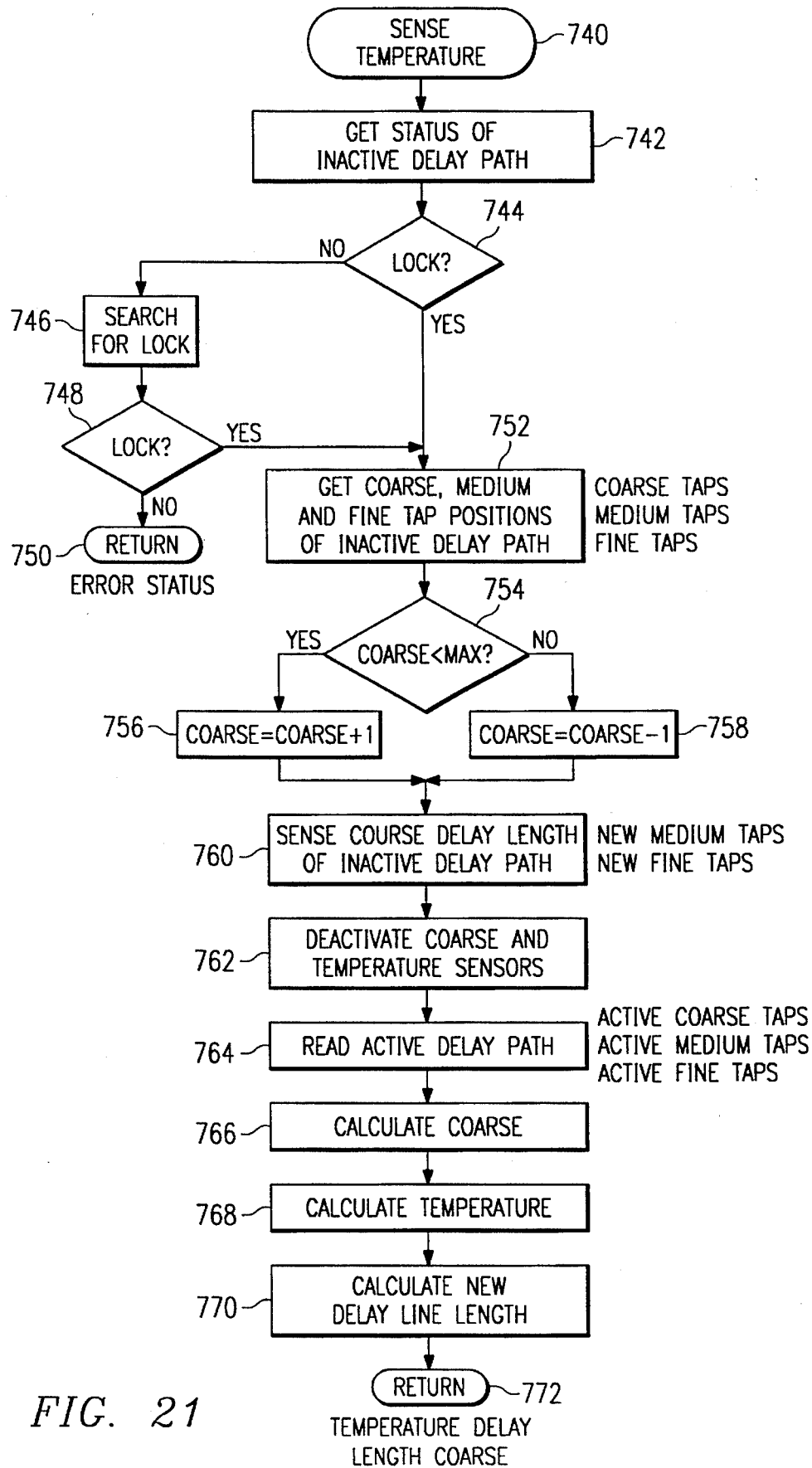
FIG. 21 is a flow chart of an embodiment of the temperature sensing process.

Referring to FIG. 20, the temperature compensation process 700 in clock alignment circuit 600 is described in more detail. The temperature compensation algorithm is structured to include an initialization loop and a temperature control loop. In block 702 at the beginning of the initialization loop, a determination is made as to which reference clock has been selected as the ACTIVE CLOCK. If ACTIVE CLOCK is CLOCK A, then delay path B 612 is used to perform the various measurements for temperature compensation, as shown in block 704. On the other hand, if ACTIVE CLOCK is CLOCK B, then delay path A 610 is used to perform the measurements, as shown in block 706. A period of the ACTIVE CLOCK is measured in terms of fine delays (CURRENT TEMP), and the effective delay length of the active delay path (CURRENT LENGTH) is also obtained in terms of fine delays. These measurements are maintained as the original values of the measurements, ORIGINAL TEMP and ORIGINAL LENGTH, as shown in block 708. Details of temperature sensing are shown in FIG. 21 and described below. In block 710, the ACTIVE CLOCK is checked to determine whether reference clock switching has occurred. For example, if CLOCK A had been initially selected as the ACTIVE CLOCK, and the check in block 710 determined that the ACTIVE CLOCK is now CLOCK B, then a reference switch had occurred and execution returns to the beginning of the initialization loop at block 702. Otherwise, the algorithm enters the temperature control loop.

While the ACTIVE CLOCK has not been switched to the other timing reference signal, the inactive delay path is used to measure the clock period (CURRENT TEMP) and the delay of a single coarse element (CURRENT COARSE), as shown in blocks 710–714. With these measurements in addition to measurements obtained in block 704 or 706, computations may be made to adjust the amount of delay in the active delay path to compensate for the changes caused by temperature variations, as shown in block 716. Details of the computation are shown in FIG. 20 and described below. A result of temperature calculation is a status variable, UPDATE, indicating whether an update or adjustment to the active delay path is necessary. This variable is checked in block 718. If an update is necessary, then the original values of the clock period and active delay path length are updated to equal to the current or new values, as shown in block 720. The algorithm then waits for a predetermined period of time before returning to the beginning of the temperature control loop.

Referring to FIG. 21, the sense temperature process 740 is described in more detail. As discussed above, the measurements of a clock period, the delay length of a coarse delay element, and the effective delay length of the active delay path are performed in the inactive delay path. Using the example of selecting CLOCK A as the ACTIVE CLOCK, then delay path B 612 is the inactive delay path. The ACTIVE CLOCK and INTERNAL REFERENCE B are provided to temperature phase detector 654 (FIG. 17) to determine whether they are in phase alignment, as shown in blocks 742 and 744. The lock status indicates that all stages 620–624 of delay path B 612 have properly aligned to the ACTIVE CLOCK. As a precautionary measure, the lock point of the delay path may be searched and obtained, as shown in block 746, if the lock status fails. If there is still no lock, then an error status is returned, as shown in blocks 748 and 750.

When all stages of the inactive delay path are locked, the tap value of each stage, COARSE TAPS, MEDIUM TAPS, and FINE TAPS, is obtained, as shown in block 752. This yields the amount of delay required to delay the ACTIVE CLOCK one clock period in terms of coarse, medium and fine delays. The tap values are then converted to one of fine delays only. If the coarse tap is less than its maximum, the coarse delay is incremented by one, as shown in blocks 754 and 756. Else, the coarse delay is decremented, as shown in block 758. New medium and fine delay tap value are then obtained after phase alignment is again obtained, as shown in block 760. This yields the effective delay of a coarse delay in terms of medium and fine delays, NEW MEDIUM TAPS and NEW FINE TAPS. The inactive delay path is then permitted to align itself with the active delay path by deactivating the temperature sensors, as shown in block 762. The active delay path tap values, ACTIVE COARSE TAPS, ACTIVE MEDIUM TAPS, and ACTIVE FINE TAPS, are then read, as shown in block 764.

With these measurements, a number of temperature compensation parameters may be computed as shown in blocks 766–770. The amount of delay for one coarse delay element in terms of the smaller delay elements may be computed:

$$\text{COARSE} = |(\text{MEDIUM TAPS} + \text{FINE TAPS}) - (\text{NEW MEDIUM TAPS} + \text{NEW FINE TAPS})| \quad (4)$$

The temperature measurement in terms of medium and fine taps may also be computed:

$$\text{TEMPERATURE} = (\text{COARSE} \times \text{COARSE TAPS}) + \text{MEDIUM TAPS} + \text{FINE TAPS} \quad (5)$$

The delay length of the active delay path may be computed by:

$$\text{DELAY LENGTH} = (\text{COARSE} \times \text{ACTIVE COARSE TAPS}) + \text{ACTIVE MEDIUM TAPS} + \text{ACTIVE FINE TAPS} \quad (6)$$

The sense temperature algorithm then ends in block 772.

Figure 22:
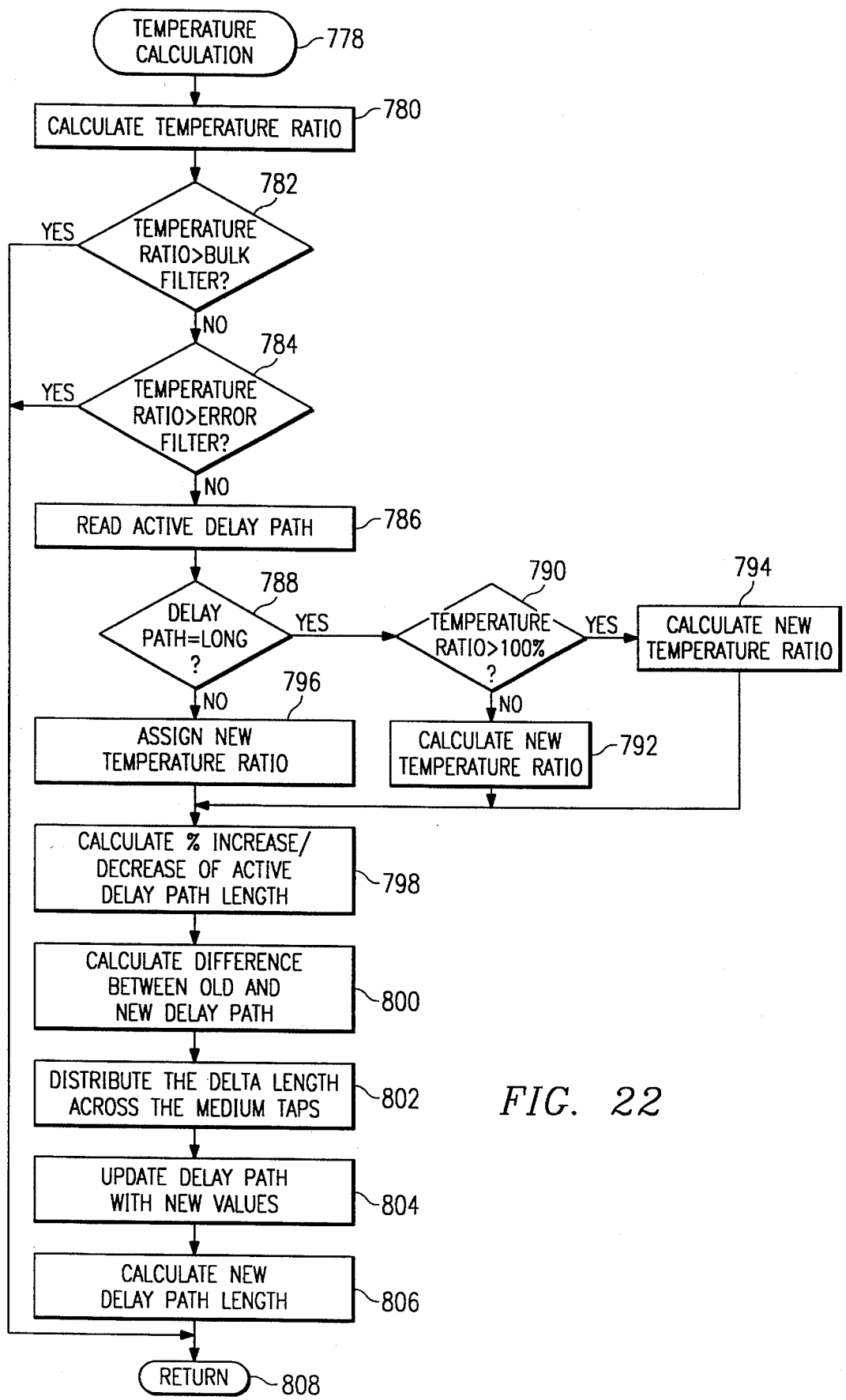
FIG. 22 is a flow chart of an embodiment of the temperature ratio computation process.

Equations (4) through (6) yield reference values and measurements from which a correction value may be computed to modify the delay of delay paths 610 and 612 to counteract with the effects of temperature. Referring to FIG. 22, an algorithm 778 to compute the correction value is shown. In block 780, a TEMPERATURE RATIO is computed with the following equation:

$$\text{TEMP RATIO} = \frac{\text{ORIGINA TEMP}}{\text{CURRENT TEMP}} \quad (7)$$

The TEMPERATURE RATIO is defined as the original or baseline temperature measurement divided by the current or subsequent measurement. The ratio is thus a percentage indication of an increase or decrease in temperature. Generally, as temperature rises, the delay through each macro increases. Likewise as temperature falls, the delay decreases. However, the rate of change may vary among the coarse, medium and fine delay stages. In an implementation where the rate of change of the coarse delay stage is faster than the medium and fine stages, the delay length of a coarse delay element rises because more fine delay elements are required to equal the effective delay of a single coarse delay element. In addition, the overall measurement decreases because less coarse delay elements and also less fine delay elements are required to equal the length of a clock period. Therefore, the temperature measurement decreases as the temperature rises, and vice versa.

The computed TEMPERATURE RATIO is then applied to a bulk filter to detect catastrophic temperature fluctuations, as shown in block 782. If the temperature measurement is greater than, for example, 120% or less than 80% of the original measurement, then the current temperature is assumed to be invalid and execution terminates. In block 784, an error filter is implemented to mask phase detector inefficiencies. For example, if phase detector 654 (FIG. 17) has an inherent error rate of ±1 fine delay tap, then if the TEMPERATURE RATIO is greater than 98% and less than 101%, the current measurement is ignored.

Next, an estimate of the delay path position is made based on the computed TEMPERATURE RATIO. A NEW TEMPERATURE RATIO is determined such that when multiplied with the current delay path length produces an estimate of where the delay path has theoretically moved as a result of temperature. The active delay path is read to determine the coarse, medium and fine delay values (COARSE TAPS, MEDIUM TAPS, and FINE TAPS), as shown in block 786. The delay path is then checked to determine whether it is long, as shown in block 788. A long delay path is defined as one containing a non-zero coarse tap value, and a short delay path is one that contains a zero coarse tap value. This differentiation is made because when the delay path contains a non-zero coarse tap value, the NEW TEMPERATURE RATIO is inversely proportional to the TEMPERATURE RATIO; when the delay path does not contain a coarse delay value, the NEW TEMPERATURE RATIO is directly proportional to the TEMPERATURE RATIO. If the delay path is not long, then the NEW TEMPERATURE RATIO is set equal to the TEMPERATURE RATIO computed in block 780, as show in block 796. If the delay path is long, then the NEW TEMPERATURE RATIO is set depending on whether the TEMPERATURE RATIO is also greater than 100%, as determined in block 790. If the TEMPERATURE RATIO is not greater than 100%, then:

$$\text{NEW TEMP RATIO} = 100\% + (100\% - \text{TEMP RATIO}), \quad (8)$$

as shown in block 792. If the TEMPERATURE RATIO is greater than 100%, then:

$$\text{NEW TEMP RATIO}=100\% -(\text{TEMP RATIO}-100\%), \quad (9)$$

as shown in block 794.

The new delay path length may then be computed by:

$$\text{NEW DELAY LENGTH}=\text{CURRENT DELAY LENGTH}* \text{NEW TEMP RATIO}, \quad (10)$$

as shown in block 798. In blocks 800 and 802, the difference between the old and new delay paths are then computed, and the difference is distributed across the medium delay stage by the following exemplary code:

```
IF((TEMP RATIO>100%)&(DELAY LINE=SHORT)) OR
    ((TEMP RATIO<100%)&(DELAY LINE=LONG)) ΔDELAY
    LENGTH=NEW DELAY LENGTH NEW MED TAPS=ME-
    DIUM TAPS+ΔDELAY LENGTH

IF((TEMP RATIO<100%)&(DELAY LINE=SHORT)) OR
    ((TEMP RATIO>100%)&(DELAY LINE=LONG)) ΔDELAY
    LENGTH=ORIG DELAY LENGTH-NEW DELAY LENGTH
    NEW MED TAPS=MEDIUM TAPS-ΔDELAY LENGTH
```

Note that in this implementation, only the medium delay stage is used to compensate for temperature variations. Thereafter, the delay path is updated with the new tap values, as shown in block 804. The new length of the delay path is then computed by:

$$\text{NEW DELAY LENGTH}=(\text{COARSE}*\text{COARSE TAPS})+\text{NEW MED TAPS}+\text{FINE TAPS}, \quad (11)$$

as shown in block 806. The UPDATE status variable is also set to TRUE at this point to enable delay path tap updating. UPDATE and NEW DELAY LENGTH are then returned, as shown in block 808.

Although the present invention and its advantages have been described in detail, it should be understood that various changes, substitutions and alterations can be made herein without departing from the spirit and scope of the invention as defined by the appended claims.

What is claimed is:

1. A circuitry for aligning first and second redundant timing signals and switching therebetween, comprising:
   a selecting and switching circuitry for receiving said first and second redundant timing signals and designating one of said redundant timing signals as ACTIVE and the other as INACTIVE;
   a first delay path having a programmable delay value coupled to said selecting circuitry, receiving said ACTIVE redundant timing signal and producing a first output timing signal;
   a second delay path having a programmable delay value coupled to said selecting circuitry, receiving said INACTIVE redundant timing signal and producing a second output timing signal;
   a phase detector coupled to said first and second delay paths, receiving said ACTIVE and INACTIVE output timing signals, and generating a status signal indicative of phase relationship therebetween; and
   a controller coupled to said phase detector for controlling said programmable delay values of said first and second delay paths to phase align said ACTIVE and INACTIVE timing signals in response to said status signal.

2. The circuitry, as set forth in claim 1, wherein said selecting and switching circuitry switches said ACTIVE and INACTIVE timing signal designations in response to detecting fault in said ACTIVE timing signal.

3. The circuitry, as set forth in claim 1, wherein said selecting and switching circuitry switches said ACTIVE and INACTIVE timing signal designations in response to a clock switching command.

4. The circuitry, as set forth in claim 1, wherein said selecting circuitry selects said ACTIVE and INACTIVE timing signals by default.

5. The circuitry, as set forth in claim 1, wherein each of said first and second delay paths comprises:
   a coarse delay circuitry having a plurality of delay elements of a coarse resolution; and
   a fine delay circuitry coupled to said coarse delay circuitry and having a plurality of delay elements of a fine resolution.

6. The circuitry, as set forth in claim 1, wherein each of said first and second delay paths comprises:
   a coarse delay circuitry having a plurality of delay elements of a coarse resolution;
   a medium delay circuitry coupled to said coarse delay circuitry and having a plurality of delay elements of a medium resolution; and
   a fine delay circuitry coupled to said medium delay circuitry and having a plurality of delay elements of a fine resolution.

7. The circuitry, as set forth in claim 1, wherein each of said first and second delay paths comprises:
   a coarse delay stage being incrementally programmable at a coarse resolution;
   a medium delay stage coupled to said coarse delay stage and being incrementally programmable at a medium resolution; and
   a fine delay stage coupled to said medium delay stage and being incrementally programmable at a fine resolution.

8. The circuitry, as set forth in claim 1, further comprising a preferred tap register coupled to said first and second delay paths and storing a preferred delay value for delaying said ACTIVE timing signal.

9. The circuitry, as set forth in claim 8, further comprising a temperature compensation circuitry for changing said preferred delay value stored in said preferred tap register in response to changes in temperature.

10. The circuitry, as set forth in claim 1, further comprising a temperature compensation circuitry for adjusting said programmable delay value of said programmable delay paths in response to changes in temperature.

11. The circuitry, as set forth in claim 10, wherein said temperature compensation circuitry comprises:
    a programmable temperature delay path receiving said ACTIVE timing signal and producing a delayed timing signal delayed by a programmable delay value;
    a temperature phase detector coupled to said programmable temperature delay path, receiving said ACTIVE timing signal and said delayed timing signal, and generating a temperature phase lock signal indicative of phase lock therebetween; and
    a control circuitry coupled to said temperature phase detector, controlling the delay of said programmable temperature delay path for periodically measuring a clock period of said ACTIVE timing signal, comparing said measured clock periods and computing a delay adjustment therefrom.

12. The circuitry, as set forth in claim 11, wherein said programmable temperature delay path includes first and second parallel delay path portions for differentially delaying said ACTIVE timing signal and producing first and second delayed ACTIVE timing signals, and said temperature phase detector receiving said first and second delayed ACTIVE timing signals and indicating phase alignment thereof.

13. The circuitry, as set forth in claim 1, wherein said second delay path delaying said INACTIVE redundant timing signal includes first and second parallel delay path portions designated as a master and slave path portions, receiving said INACTIVE timing signal and having programmable delay values, said controller further controls said programming delay values of said master and slave path portions to phase align said master path portion timing signal with said ACTIVE timing signal, and to further phase align said slave path portion timing signal with said master path portion timing signal.

14. The circuitry, as set forth in claim 13, wherein said controller switches said master and slave path portion designations in response to achieving phase lock therebetween and said master path portion reaching a maximum or minimum delay.

15. The circuitry, as set forth in claim 1, wherein said controller computes an average delay value and controlling said programmable delay value of said second delay path to align said INACTIVE timing signal with said ACTIVE timing signal.

16. The circuitry, as set forth in claim 1, wherein said phase detector comprises:
    a phase processor receiving a first and second signals for alignment and generating a PHASE DIRECTION vector and a PHASE CLOCK;
    a loss of clock circuitry coupled to said phase processor, receiving said PHASE CLOCK and generating a LOSS OF PHASE CLOCK signal; and
    an output processor coupled to said phase processor and said loss of clock circuitry and generating delay path control signals in response to said PHASE DIRECTION vector and said LOSS OF PHASE CLOCK signals.

17. In a telecommunication system having multiple timing subsystems receiving and distributing redundant timing signals, there is provided a circuitry for aligning first and second redundant timing signals and switching therebetween, comprising:
    a selecting and switching circuitry for receiving said first and second redundant timing signals and designating one of said redundant timing signals as ACTIVE and the other as INACTIVE, and providing said ACTIVE timing signal as an output timing reference signal, said selecting and switching circuitry further switching said ACTIVE and INACTIVE timing signal designation and said output timing reference signal in response to receiving a loss of frame loss of clock, or a clock switching signal;
    a first delay path having a programmable delay value coupled to said selecting circuitry, receiving said ACTIVE redundant timing signal and producing a first output timing signal;
    a second delay path having a programmable delay value coupled to said selecting circuitry, receiving said INACTIVE redundant timing signal and producing a second output timing signal;
    a phase detector coupled to said first and second delay paths, receiving said ACTIVE and INACTIVE output timing signals, and generating a status signal indicative of phase relationship therebetween;
    a temperature compensation circuit coupled to said first and second delay paths and measuring an effect of temperature change on said delay paths;
    a controller coupled to said phase detector for controlling said programmable delay values of said first and second delay paths to phase align said output timing signals in response to said status signal, and further coupled to said temperature compensation circuit for adjusting said programmable delay values in response to said measured effect of temperature change on said delay paths.

18. The circuitry, as set forth in claim 17, wherein each of said first and second delay paths comprises:
    a coarse delay circuitry having a plurality of delay elements of a coarse resolution;
    a medium delay circuitry coupled to said coarse delay circuitry and having a plurality of delay elements of a medium resolution; and
    a fine delay circuitry coupled to said medium delay circuitry and having a plurality of delay elements of a fine resolution.

19. The circuitry, as set forth in claim 17, wherein each of said first and second delay paths comprises:
    a coarse delay stage being incrementally programmable at a coarse resolution;
    a medium delay stage coupled to said coarse delay stage and being incrementally programmable at a medium resolution; and
    a fine delay stage coupled to said medium delay stage and being incrementally programmable at a fine resolution.

20. The circuitry, as set forth in claim 17, further comprising a preferred tap register coupled to said first and second delay paths and storing a preferred delay value for delaying said ACTIVE timing signal.

21. The circuitry, as set forth in claim 20, further comprising a temperature compensation circuitry for changing said preferred delay value stored in said preferred tap register in response to changes in temperature.

22. The circuitry, as set forth in claim 17, further comprising a temperature compensation circuitry for adjusting said programmable delay value of said programmable delay paths in response to changes in temperature.

23. The circuitry, as set forth in claim 22, wherein said temperature compensation circuitry comprises:
    a programmable temperature delay path receiving said ACTIVE timing signal and producing a delayed timing signal delayed by a programmable delay value;
    a temperature phase detector coupled to said programmable temperature delay path, receiving said ACTIVE timing signal and said delayed timing signal, and generating a temperature phase lock signal indicative of phase lock therebetween; and
    a control circuitry coupled to said temperature phase detector, controlling the delay of said programmable temperature delay path for periodically measuring a clock period of said ACTIVE timing signal, comparing said measured clock periods and computing a delay adjustment therefrom.

24. The circuitry, as set forth in claim 22, wherein said programmable temperature delay path includes first and second parallel delay path portions for differentially delaying said ACTIVE timing signal and producing first and second delayed ACTIVE timing signals, and said temperature phase detector receiving said first and second delayed ACTIVE timing signals and indicating phase alignment thereof.

25. The circuitry, as set forth in claim 17, wherein said first and second delay paths each includes first and second parallel delay path portions.

26. A method for aligning and switching between first and second redundant timing signals, comprising the steps of:

selecting one of said first and second timing signals as an ACTIVE timing signal and the other as an INACTIVE timing signal, and providing said ACTIVE timing signal as an output timing reference;

detecting a phase relationship of said ACTIVE and INACTIVE timing signals;

incrementally delaying said INACTIVE timing signal until said detected phase relationship of said INACTIVE timing signal and said ACTIVE timing signal is in phase alignment; and switching said ACTIVE and INACTIVE timing signal designation and said output timing reference signal in response to receiving a loss of frame or loss of clock signal for said ACTIVE timing signal or a clock switching command.

27. The method, as set forth in claim 26, wherein said incrementally delaying step comprises the steps of:

providing said ACTIVE timing signal to a first delay path;

providing said INACTIVE timing signal to a second delay path;

controllably delaying said ACTIVE timing signal by a preferred delay amount; and incrementally adjusting the delay of said second delay path until said INACTIVE timing signal is in phase alignment with said ACTIVE timing signal.

28. The method, as set forth in claim 27, wherein said incrementally adjusting step comprises the steps of:

locating respective edges in said ACTIVE and INACTIVE timing signals;

determining a leading or lagging phase relationship between said located edges; and incrementing or decrementing the delay of said INACTIVE timing signal in response to said leading or lagging phase relationship, respectively.

29. The method, as set forth in claim 27, further comprising the steps of:

periodically detecting an effect of changing temperature on the delay of said ACTIVE timing signal;

adjusting said preferred delay amount in response to said detected effect of changing temperature.

30. The method, as set forth in claim 29, wherein said changing temperature effect detecting step comprises the steps of:

providing said ACTIVE timing signal to both said first and second delay paths;

noting and comparing the difference in the amount of delay in said first and second delay paths; and incrementally delaying said ACTIVE timing signal on said second delay path until said ACTIVE timing signals on said first and second delay paths are in phase alignment.

31. The method, as set forth in claim 29, wherein said changing temperature effect detecting step comprises the steps of:

providing said ACTIVE timing signal to said first delay path and a temperature delay path;

noting and comparing the difference in the amount of delay therein; and incrementally delaying said ACTIVE timing signal on said temperature delay path until said ACTIVE timing signals on said first delay path and temperature delay path are in phase alignment.

32. The method, as set forth in claim 30, further comprising the step of computing a delay adjustment to said delay paths in response to said delay amount comparison.

33. The method, as set forth in claim 31, further comprising the step of computing a delay adjustment to said delay paths in response to said delay amount comparison.

34. The method, as set forth in claim 26, further comprising the steps of:

designating said INACTIVE timing signal as a master timing signal and a slave signal;

adjustably delaying said master timing signal to achieve phase alignment with said ACTIVE timing signal; and adjustably delaying said slave timing signal to achieve phase alignment with said master timing signal.

35. The method, as set forth in claim 34, further comprising a step of switching said master and slave designations in response to achieving phase lock therebetween and said master path portion reaching a maximum or minimum delay.

36. The method, as set forth in claim 26, further comprising the steps of:

after said incrementally delaying step, storing a first delay value;

continuing incrementally delaying said INACTIVE timing signal until said INACTIVE timing signal is out of phase alignment with said ACTIVE timing signal and storing a second delay value; and computing an average of said first and second delay values and delaying said INACTIVE timing signal by said computed average amount.

37. An integrated circuit for aligning and switching a first and second redundant timing reference signals, comprising:

circuitry for selecting from said first and second redundant timing reference signals an active timing reference;

a first delay pipeline receiving said first redundant timing reference signal, delaying said first redundant timing signal by a first programmable delay amount, and generating a first internal reference timing signal;

a second delay pipeline receiving said second redundant timing reference signal, delaying said second redundant timing signal by a second programmable delay amount, and generating a second internal reference timing signal;

a first phase detector coupled to said first delay pipeline and generating a first set of delay pipeline control signals in response to a phase relationship between said active timing reference and said first internal reference timing signal if said second redundant timing reference is designated as said active timing reference, and said first delay pipeline delaying said first redundant timing reference in response to said delay pipeline control signals;

a second phase detector coupled to said second delay pipeline and generating a second set of delay pipeline control signals in response to a phase relationship between said active timing reference and said second internal reference timing signal if said first redundant timing reference is designated as said active timing reference, and said second delay pipeline delaying said second redundant timing reference in response to said delay pipeline control signals; and circuitry for switching said active timing reference between said first and second redundant timing reference signals in response to receiving a clock switching command or a loss of frame or loss of clock signal.

38. The integrated circuit, as set forth in claim 37, further comprising a PTV compensation circuit.

39. The integrated circuit, as set forth in claim 38, wherein said PTV compensation circuit comprises a third phase detector coupled to said first and second delay pipelines, detecting a phase relationship between said active timing reference and first or second internal reference timing signal, and generating a set of compensation delay pipeline control signals in response thereto.

40. The integrated circuit, as set forth in claim 37, wherein said first and second phase detectors each comprises:

a phase processor receiving said first or second internal reference timing signal, respectively, and said active timing reference, and generating a phase relationship therebetween and a phase clock indicative of a time lag between said internal reference timing signal and said active timing reference;

a loss of clock detector receiving said phase clock and said active timing reference and generating a loss signal in response to an absence of said phase clock; and an output processor coupled to said phase processor and loss of clock detector, and generating said pipeline control signals in response to said phase direction, active timing reference, and said loss signal.

* * * * *